United States Patent
Hayashi et al.

(10) Patent No.: US 6,271,697 B1
(45) Date of Patent: Aug. 7, 2001

(54) SEMICONDUCTOR INTEGRATED CIRCUIT DEVICE

(75) Inventors: Isamu Hayashi; Harufusa Kondoh, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/429,634

(22) Filed: Oct. 29, 1999

Related U.S. Application Data

(62) Division of application No. 08/268,159, filed on Jun. 29, 1994, now abandoned.

(30) Foreign Application Priority Data

Jun. 30, 1993 (JP) .................................................. 5-161869

(51) Int. Cl.⁷ ...................................................... H03L 7/06
(52) U.S. Cl. ............................ 327/158; 327/159; 327/295
(58) Field of Search ..................................... 327/291, 292, 327/295, 298, 156, 158

(56) References Cited

U.S. PATENT DOCUMENTS

| | | |
|---|---|---|
| 5,036,230 | 7/1991 | Bazes . |
| 5,059,924 | 10/1991 | Jenningscheck . |
| 5,101,117 | 3/1992 | Johnson et al. . |
| 5,132,633 | 7/1992 | Wong et al. . |
| 5,157,277 | 10/1992 | Tran et al. . |
| 5,180,995 | 1/1993 | Hayashi et al. . |
| 5,192,886 | 3/1993 | Wetlaufer . |
| 5,218,314 | 6/1993 | Efendovich et al. . |
| 5,295,164 | 3/1994 | Yamamura . |
| 5,307,381 | 4/1994 | Ahuja . |
| 5,313,503 | 5/1994 | Jones et al. . |
| 5,347,233 | 9/1994 | Ishibashi et al. . |
| 5,355,097 | 10/1994 | Scott et al. . |
| 5,376,848 | 12/1994 | Hanke, III et al. . |
| 5,436,939 | 7/1995 | Co et al. . |
| 5,448,191 | 9/1995 | Meyer . |
| 5,451,894 | * 9/1995 | Guo ...................................... 327/277 |
| 5,579,350 | * 11/1996 | Furukawa et al. .................... 327/161 |

FOREIGN PATENT DOCUMENTS

| | | |
|---|---|---|
| 1-261018 | 10/1989 | (JP) . |
| 2-194721 | 8/1990 | (JP) . |

OTHER PUBLICATIONS

Principles of CMOS VLSI Design–A Systems Perspective, (1985 Addison–Wesley Publishing Company).

* cited by examiner

Primary Examiner—Kenneth B. Wells
(74) Attorney, Agent, or Firm—McDermott, Will & Emery

(57) ABSTRACT

In an internal clock signal generation circuit, a plurality of internal clock signals of different phases are generated based on an external clock signal. The internal clock signals are synchronized with the external clock signal by a PPL circuit. The plurality of internal clock signals are respectively supplied to a plurality of internal circuit blocks. Since the phases of the generated internal clock signals are different the phases of the internal clock signals arriving at the internal circuit blocks can be matched even if delays of the signals between the internal clock signal generation circuit and the plurality of internal circuit blocks are different. Thus, clock skews between the plurality of internal clock signals can be reduced and the phase of the internal clock signal and the phase of the external clock signal can be synchronized.

8 Claims, 24 Drawing Sheets

SEMICONDUCTOR INTEGRATED CIRCUIT DEVICE

This Application is a Division of Ser. No. 08/268,159 filed Jun. 29, 1994, abandoned.

BACKGROUND OF THE INVENTION

1. Field of the Invention

The present invention relates generally to semiconductor integrated circuit devices, and more particularly, to a semiconductor integrated circuit device capable of supplying internal clock signals in various timings to internal circuit blocks and input/output latch circuits which operate synchronously with internal clock signals.

2. Description of the Background Art

In the field of semiconductor integrated circuit devices, with the advance of large scale integration and high speed operation of circuits, skews of clock signals are no longer ignorable. As the number of pins increases in response to such large scale integration of circuits, the magnitude of simultaneous switching noises poses a serious problem.

FIG. 21 is a block diagram showing an example of a conventional semiconductor integrated circuit device. Referring to FIG. 21, the LSI includes on a semiconductor substrate 100, a driver transistor 101, input buffer circuits 31, 32, and 33, input latch circuits 41, 42 and 43, internal circuit blocks 21, 22 and 23, output latch circuits 51, 52 and 53, and output buffer circuits 61, 62 and 63.

First internal circuit block 21 receives as an input an externally applied first input data signal I1 through first input buffer circuit 31 and first input latch circuit 41. A first output data signal O1 is output externally from the LSI from first internal circuit block 21 through first output latch circuit 51 and first output buffer circuit 61.

Similarly, second internal circuit block 22 receives an external second input data signal I2 through second input buffer circuit 32 and second input latch circuit 42. A second output data signal O2 is output externally from the LSI from second internal circuit block 22 through second output latch circuit 52 and second output buffer circuit 62.

Similarly, third internal circuit block 23 receives as an input an externally applied third input data signal I3 through third input buffer circuit 33 and third input latch circuit 43. A third output data signal O3 is output externally from the LSI from third internal circuit block 23 through third output latch circuit 53 and third output buffer circuit 63.

Driver transistor 101 receives an external clock signal CLK which is externally applied to the LSI. Driver transistor 101 provides a single internal clock signal to first to third input latch circuits 41 to 43, first to third internal circuit blocks 21 to 23, and first to third output latch circuits 51 to 53.

Now, operation of the LSI in FIG. 21 will be described. Driver transistor 101 responds to external clock signal CLK and outputs a single internal clock signal simultaneously to first to third input latch circuits 41 to 43, first to third internal circuit blocks 21 to 23, and first to third output latch circuits 51 to 53.

First to third input latch circuits 41 to 43, first to third internal circuit blocks 21 to 23, and first to third output latch circuits 51 to 53 operate in synchronization with the provided internal clock signal.

The operation will be described by way of illustrating the signal transmission path from first input buffer circuit 31 to first output buffer circuit 61. First input data signal I1 is applied to first input latch circuit 41 through first input buffer circuit 31. First input latch circuit 41 performs a prescribed latch operation in synchronization with the applied internal clock signal, and applies the applied first input data signal I1 to first internal circuit block 21.

First internal circuit block 21 performs a prescribed signal processing to first input data signal I1 in synchronization with the applied internal clock signal, and applies first output data signal O1 to first output latch circuit 51 as a result. First output latch circuit 51 performs a prescribed latch operation in synchronization with the applied internal clock signal, and applies the applied first output data signal O1 to first output buffer circuit 61 as a result. First output data signal O1 is output externally from the LSI through first output buffer circuit 61.

The operation of each element in the signal transmission path from second input buffer circuit 32 to second output buffer circuit 62 and the operation of each element in the signal transmission path from third input buffer circuit 33 to third output buffer circuit 63 are conducted similar to the operation of each element in the signal transmission path from first input buffer circuit 31 to first output buffer circuit 61 described above.

Such a conventional semiconductor integrated circuit device is encountered with the following problems for its configuration.

Firstly, difference in distances from driver transistor 101 to respective internal circuit blocks generates a clock skew for an internal clock signal between the internal circuit blocks, which results in erroneous operations when the LSI operates at a high speed.

Secondly, since all output data signals are outputted simultaneously in order that each output circuit can operate synchronously with a single internal clock signal, simultaneous switching noises are generated. The simultaneous switching noise is caused by currents which are passed through semiconductor substrate 100 in response to simultaneous switching operations of a plurality of output buffer circuits.

Thirdly, in a system for transmitting/receiving data signals between a plurality of LSIs, if a signal is delayed to different degrees between LSIs and yet the LSIs operate in the same operation timing, each LSI cannot appropriately receive a data signal output from another LSI for the delay of the data signal. In order to solve such a problem, input/output timings for data signals to/from LSIs must be different. In a conventional LSI, however, the operation timing of an input latch circuit and the operation timing of an output latch circuit are fixed. Changing input/output timings for data signals after LSIs are mounted onto the board requires troublesome operation of changing the phases of internal clock signals to be produced in the LSIs.

Finally, since in a conventional LSI input latch circuits have the same operation timing, if data signals are delayed differently for every signal line connected to each input latch circuit after the LSIs are mounted on the board, delay elements must be inserted in the signal lines in order to match the phases of data signals to be inputted to the input latch circuits. Similarly, if data signals are delayed differently for every signal line connected to each output latch circuit, a delay element must be inserted in each signal line in order to make the phases of output data signals in phase in an LSI to which that data signals are destined. Such insertion of delay elements in signal lines expands the mounting area of the circuit.

An invention related to a solution to clock skews between a plurality of LSIs for clock signals applied to the LSIs is disclosed, for example, in Japanese Patent Laying-Open No. 1-261018. The invention disclosed in the document includes within the LSI a delay signal generation circuit for generating a plurality of delay signals by delaying a clock input signal by small amounts, and a select circuit for selectively outputting a necessary delay signal from said plurality of delay signals. According to the document, the delay signal generation circuit and the select circuit adjust clock skews between a plurality of LSIs operating synchronously with a clock input signal.

As an invention directed to a solution to interphase skews in internal clock signals of a plurality of phases generated based on an external clock signal is disclosed, for example, in Japanese Patent Laying-Open No. 2-194721. The invention disclosed in the document includes a frequency dividing circuit for frequency-dividing an external clock signal and a differential circuit receiving the output signal of the frequency dividing circuit. According to the document, internal clock signals of a plurality of phases with reduced interphase skews are generated based on an external clock signal by the provision of these circuits.

These two inventions concern a solution to a clock skew between a plurality of clock signals by delaying clock signals. Accordingly, application of such techniques generates a plurality of internal clock signals of difference phases by delaying the external clock signal bit by bit in the signal generation portion, and clock skews between internal circuit blocks would be solved by these internal clocks supplied to a plurality of internal circuit blocks spaced at different distances from the signal generation portion, respectively.

However, an LSI in which a plurality of internal clock signals of difference phases are simply generated for application to internal circuit blocks is further encountered with the following problem. The problem will be described.

FIG. 22 is a block diagram showing part of a transmission path for clock signal and a transmission path for internal data signal in a conventional LSI. In FIG. 22, transmission paths for internal clock signal and data signal through a clock buffer circuit 102, an output latch circuit 54, and an output buffer circuit 64 are shown as examples of such transmission paths for clock signal and data signal.

Clock buffer circuit 102 generates an internal clock signal in response to an external clock signal CLK. Output latch circuit 54 receives the internal clock signal and a data signal applied from an internal circuit block (not shown), performs a latch operation for the data signal in response to the internal clock signal and outputs the data signal as output data signal O through output buffer circuit 64.

FIG. 23 is a waveform chart showing signals at respective elements in the LSI in FIG. 22. The waveforms shown in FIG. 23 are those of external clock signal CLK, an internal clock signal a at an output node of clock buffer circuit 102, an internal clock signal b at an input node of output latch circuit 54, a data signal c at an output node of output latch circuit 54, and output data signal O.

Referring to FIG. 23, problems associated with the above-described two inventions will be described.

Internal clock signal a has a delay Dcb from external clock signal CLK through clock buffer circuit 102. Internal clock signal b has a delay Dline from internal clock signal a through the interconnection from clock buffer circuit 102 to output latch circuit 54. Data signal c has a delay Dol from internal clock signal b which corresponds to the period from a rising of the internal clock signal to latch output in output latch circuit 54. Output data signal O has a delay Dob from data signal c through output buffer circuit 64.

With these delays, the delay Dtotal of output data signal O with respect to external clock signal CLK is the total of all the delays Dcb, Dline, Dol, and Dob. Such delays Dcb, Dline, Dol, and Dob each fluctuate with temperature and process irregularities. The above two inventions therefore cannot prevent the variance of output timings for output data signals in the LSI.

Such delays for output data signals with respect to an external clock signal is disadvantageous for following reasons.

FIG. 24 is a block diagram showing the configuration of a CPU and a plurality of LSIs which operate in synchronization with a common system clock. Referring to FIG. 24, CPU 300, first LSI 301 and second LSI 302 are connected to a common bus 304. CPU 300, first LSI 301 and second LSI 302 operate in synchronization with a system clock signal (external clock signal) and transmit/receive data between them.

In operation, when one of first LSI 301 and second LSI 302 outputs data, the output of the other is brought to a high impedance state, in order to avoid collision of the data outputted from first LSI 301 and data outputted from second LSI 302.

The operation will be described. FIG. 25 is a timing chart for use in illustration of a normal operation state of the system shown in FIG. 24. FIG. 25 includes a system clock signal SC, the data output signal A of first LSI 301 and the output data signal B of second LSI 302.

Referring to FIG. 25, first LSI 301 and second LSI 302 output data signals A and B in synchronization with system clock signal SC. In this case, when one LSI outputs data d, the output data signal of the other LSI attains a high impedance HZ. Thus, data d outputted from first LSI 301 does not collide with data d outputted from second LSI 302.

In the following case, however, data d outputted from these two LSI 301 and 302 collide with each other. FIG. 26 is a timing chart for use in illustration of an abnormal operation of the system shown in FIG. 24. FIG. 26 also includes system clock signal SC, the output data signal A of first LSI 301, and the output data signal B of second LSI 302. FIG. 26 shows an example of an abnormal operation of the system in FIG. 24, in which the output data signal B of second LSI 302 is delayed from the output data signal A of first LSI 301.

Referring to FIG. 26, when output data signal B is delayed by delay Dtotal from the external clock signal, system clock signal SC as described above, data d collide with each other in a period t1 as a result of delay Dtotal.

In order to prevent such collision of data d, the output timing of output data signal A must be delayed such that output data signals A and B are in phase. However, the delay Dtotal of the output data signal with respect to the external clock signal fluctuates depending upon temperature and process irregularities as described above. Therefore, adjusting delay Dtotal requires readjustment of the system after designed (after actually mounted on the board).

Now, problems associated with delays of output data signals from the external clock signal will be described. FIG. 27 is a block diagram showing a system in which data signals are transmitted/received between at least three LSIs.

Referring to FIG. 27, the system includes a first LSI 401, a second LSI 402, and a third LSI 403. A first interconnection line 1 is provided between first LSI 401 and second LSI 402. A second interconnection line 2 is provided between first LSI 401 and third LSI 403. A third interconnection line 3 is provided between second LSI 401 and third LSI 403.

Now, the operation of the system in FIG. 27 will be described. The output data signal of first LSI 401 is applied to second LSI 402 through first interconnection line 1 and to third LSI 403 through second interconnection line 2. The output data signals applied to second and third LSIs 402 and 403 are simultaneously output from first LSI 401. Third LSI 403 performs data processing for 1 clock to the applied output data signal, and applies the resulting output data signal to second LSI 402 through third interconnection line 3.

Such a system is encountered with the following problem due to delays of output data signals with respect to an external clock signal. FIG. 28 is a timing chart for use in illustration of the operation of the system in FIG. 27.

FIG. 28 includes a data signal AO at an output node on the side of first interconnection line 1 in first LSI 401, a data signal BI1 at an input node on the side of first interconnection line 1 in second LSI 402, a data signal BI2 at an input node on the side of third interconnection line 3 in second LSI 402, a data signal CI at an input node of third LSI 403, and a data signal CO at an output node of third LSI 403.

Referring to FIG. 28, data A1, A2, . . . are sequentially outputted from first LSI 401. Data signal BI1 has a delay Dline 1 through first interconnection line 1. Data signal CI1 has a delay Dline 2 with respect to data signal AO through second interconnection line 2. Data signal CO has a delay Dchip with respect to data signal AO by a delay of the data signal within third LSI 403. Data signal BI2 has a delay Dline 3 with respect to data signal CO through third interconnection Dline 3.

In this case, second LSI 402 can receive the data A2 of data signal BI1 and the data C1 of data signal BI2 at a time in a period T2 (=T-Dchip) produced by subtracting delay Dchip from the cycle T of external clock signal. This however applies only if delay Dline 1 is equal to delay Dline 3. In this system, as delay Dtotal in third LSI 403 increases, delay Dchip increases as well. As delay Dchip increases, cycle T2 increases.

In this system, second LSI 402 must receive the data signal applied from first LSI 401 and the data signal applied from third LSI 403 at a time. To this end, the timings of the data signals from first LSI 401 and third LSI 403 must be equalized by insertion of an additional element such as a delay element to first interconnection line 1 after the system is designed.

The above-described two inventions are also encountered with another problem. More specifically, an external clock signal and an internal clock signal cannot be in phase. A still another problem is encountered. More specifically, once the duty cycle of the external clock signal applied to the LSI is below 50% by the influence of temperature changes and electrical characteristics of signal transmission paths provided externally to the LSI, the duty cycle cannot be recovered to 50%.

SUMMARY OF THE INVENTION

It is an object of the present invention to reduce clock skews, keep an external clock signal and an internal clock signal in phase, compensate for the duty cycle of the internal clock signal, and reduce differences in the output timings of internal circuit blocks.

Another object of the invention is to reduce simultaneous switching noises.

Yet another object of the invention is to variably set input/output timings for data signals.

A semiconductor integrated circuit device according to the present invention operates in synchronization with an internal clock signal generated based on an externally input external clock signal and includes an internal clock signal generation circuit and a plurality of internal circuit blocks.

The internal clock signal generation circuit generates a plurality of internal clock signals of difference phases in response to the input external clock signal. The internal clock signal generation circuit includes a phase locked loop circuit.

The phase locked loop circuit synchronizes the phase of an internal clock signal to be fed back among a plurality of internal clock signals with the phase of the input external clock signal.

The plurality of internal circuit blocks are supplied with the plurality of internal clock signals generated by the internal clock signal generation circuit, respectively and operate in synchronization with the supplied internal clock signals.

Thus, the plurality of internal clock signals of different phases are generated and supplied to the plurality of internal circuit blocks, respectively. Therefore, the phases of the internal clock signals to be generated are made different depending upon the degrees of delays of signals between the internal clock signal generation circuit and the internal circuit blocks, in order to match the phases of the internal clock signals arriving at the respective internal circuit blocks. As a result, clock skews between the internal clock signals can be reduced.

In addition, the phases of some of the internal clock signals are synchronized with the phase of the external clock signal by the phase locked loop circuit. The phase of the internal clock signal thus coincides with the phase of the external clock signal. Furthermore, an internal clock signal having a duty cycle of 50% can be generated irrespective of the duty cycle of the external clock signal. In addition, differences in the output timings of data signals due to temperature and process irregularities can be prevented.

A semiconductor integrated circuit device according to another aspect of the invention operates in synchronization with an internal clock signal generated based on an externally input clock signal and includes an internal clock signal generation circuit, an output latch circuit and a signal selective supply circuit.

The internal clock signal generation circuit generates a plurality of internal clock signals of different phases in response to an input external clock signal. The internal clock signal generation circuit includes a phase locked loop circuit.

The phase locked loop circuit synchronizes the phase of an internal clock signal to be fed back among the plurality of internal clock signals with the phase of the input external clock signal.

The output latch circuit performs a latch operation of a data signal to be output externally from the semiconductor integrated circuit device in synchronization with the supplied internal clock signal.

The signal selective supply circuit selectively supplies the plurality of internal clock signals generated by the internal clock signal generation circuit to the output latch circuit.

Thus, the plurality of internal clock signals of different phases are generated and selectively supplied to the output latch circuit. Accordingly, the operation timing of the output latch circuit can be made variable. As a result, the timing of externally outputting the data signal can be made variable.

In addition, by the phase locked loop circuit, the phases of some of the internal clock signals are synchronized with the phase of the external clock signal. As a result, the phase of the internal clock signal can coincide with the phase of the external clock signal. Furthermore, an internal clock signal having a duty cycle of 50% can be generated irrespective of the duty cycle of the external clock signal. In addition, differences in the output timings of data signals due to temperature and process irregularities can be prevented.

A semiconductor memory device according to yet another aspect of the invention operates in synchronization with an internal clock signal generated base on an externally input external clock signal and includes an internal clock signal generation circuit, an input latch circuit, and a signal selective supply circuit.

The internal clock signal generation circuit generates a plurality of internal clock signals of different phases in response to the input external clock signal. The internal clock signal generation circuit includes a phase locked loop circuit.

The phase locked loop circuit synchronizes the phase of an internal clock signal to be fed back among the plurality of internal clock signals with the phase of the input external clock signal.

The input latch circuit performs a latch operation of an external data signal input to the semiconductor integrated circuit device in synchronization with the supplied internal clock signal.

The signal selective supply circuit selectively supplies the plurality of internal clock signals generated by the internal clock signal generation circuit to the input latch circuit.

As described above, a plurality of internal clock signals of different phases are generated and selectively supplied to the input latch circuit. Accordingly, the operation timing of the input latch circuit can be variable. As a result, the timing of receiving an external data signal can be made variable.

In addition, the phases of some of the internal clock signals are synchronized with the phase of the external clock signal by the phase locked loop circuit. As a result, the phase of the internal clock signal can coincide with the phase of the external clock signal. Furthermore, an internal clock signal having a duty cycle of 50% can be generated irrespective of the duty cycle of the external clock signal.

A semiconductor integrated circuit device according to a still further aspect of the invention operates in synchronization with an internal clock signal generated based on an externally input clock signal and includes an internal clock signal generation circuit, a plurality of output latch circuits, and a plurality of signal selective supply circuits.

The internal clock signal generation circuit generates a plurality of internal clock signals of different phases in response to the input external clock signal. The internal clock signal generation circuit includes a phase locked loop circuit.

The phase locked loop circuit synchronizes the phase of an internal clock signal to be fed back among the plurality of internal clock signals with the phase of the input external clock signal.

The plurality of output latch circuits each perform a latch operation of a data signal output externally to the semiconductor integrated circuit device in synchronization with the supplied internal clock signal.

The plurality of signal selective supply circuits are provided corresponding to the plurality of output latch circuits. The plurality of signal selective supply circuits each selectively supply one of the plurality of internal clock signals generated by the internal clock signal generation circuit to a corresponding output latch circuit.

As described above, a plurality of internal clock signals of different phases are generated. In each of the plurality of output latch circuits, an internal clock signal is selectively supplied from a corresponding signal selective supply circuit. Supply of internal clock signals of different phases to the output latch circuits varies the operation timings of the output latch circuits for every output latch circuit. As a result, simultaneous switching noises can be reduced.

In addition, the phases of some of the internal clock signals are synchronized with the phase of the external clock signal by the phase locked loop circuit. As a result, the phase of the internal clock signal can coincide with the phase of the external clock signal. Furthermore, an internal clock signal having a duty cycle of 50% can be generated irrespective of the duty cycle of the external clock signal. In addition, differences in the output timings of data signals due to temperature and process irregularities can be prevented.

A semiconductor integrated circuit device according to a still further aspect of the invention operates in synchronization with an internal clock signal generated based on an externally input clock signal and includes an internal clock signal generation circuit, a plurality of input latch circuits and a plurality of signal selective supply circuits.

The internal clock signal generation circuit generates a plurality of internal clock signals of different phases in response to the input external clock signal. The internal clock signal generation circuit includes a phase locked loop circuit.

The phase locked loop circuit synchronizes the phase of an internal clock signal to be fed back among the plurality of internal clock signals with the phase of the externally input clock signal.

The plurality of input latch circuits each perform a latch operation of a data signal input externally to the semiconductor integrated circuit device in synchronization with a supplied internal clock signal.

The plurality of signal selective supply circuits are provided corresponding to the plurality of input latch circuits. The plurality of signal selective supply circuits each selectively supply one of the plurality of internal clock signals generated by the internal clock signal generation circuit to a corresponding input latch circuit.

As described above, a plurality of internal clock signals of different phases are generated. In each of the plurality of input latch circuits, the internal clock signals are selectively supplied from corresponding signal selective supply circuits.

Accordingly, supply of internal clock signals of different phases to the input latch circuits varies the operation timings of the input latch circuits on an input latch circuit basis. As a result, simultaneous switching noises can be reduced.

In addition, the phases of some of the internal clock signals are synchronized with the phase of the external clock signal by the phase locked loop circuit. As a result, the phase of the internal clock signal can coincide with the phase of the external clock signal. In addition, an internal clock signal having a duty cycle of 50% can be generated irrespective of the duty cycle of the external clock signal.

A semiconductor integrated circuit device according to a still further aspect of the invention operates in synchronization with an internal clock signal generated based on an externally input clock signal and includes an internal clock signal generation circuit, a plurality of internal circuit blocks and a plurality of signal transmission paths.

The internal clock signal generation circuit generates a plurality of internal clock signals of different phases in response to the external clock signal.

The plurality of internal circuit blocks operate in synchronization with the plurality of internal clock signals generated by the internal clock signal generation circuit, respectively.

The plurality of signal transmission paths are provided between the internal clock signal generation circuit and the plurality of internal circuit blocks. The plurality of signal transmission paths each transmit an internal clock signal from the internal clock signal generation circuit to an internal circuit block and transmit the internal clock signal transmitted to the internal circuit block to the internal clock sinal generation circuit as a feedback signal.

In addition, the internal clock signal generation circuit includes a phase locked loop circuit, a phase comparison circuit, and a delay circuit.

The phase locked loop circuit receives the external clock signal and a first feedback signal of the plurality of feedback signals, and based on the phase difference between these signals synchronizes the phase of a first internal clock signal to be generated with the phase of the external clock signal.

The phase comparison circuit receives the first feedback signal and at least a second feedback signal of the plurality of feedback signals and produces a phase difference between the phases of these signals by comparison.

The delay circuit receives the first internal clock signal, delays the first internal clock signal based on the phase difference produced by the phase difference comparison circuit and produces a second internal clock signal.

As described above, a plurality of internal clock signals of different phases generated by the internal clock signal generation circuit are transmitted to the plurality of internal circuit blocks through the plurality of signal transmission paths, respectively. The internal clock signals transmitted to the internal circuit blocks are transmitted to the internal clock signal generation circuits as feedback signals through the plurality of signal transmission paths.

In the internal clock signal generation circuit, the phase locked loop circuit synchronizes the phase of the first internal clock signal and the phase of the external clock signal based on a phase difference between the external clock signal and the first feedback signal. The phase difference between the first feedback signal and the second feedback signal is produced by the phase comparison circuit. The phase different represents the degree of a delay present between the first internal clock signal transmitted between the internal circuit block in which the first feedback signal is obtained and the internal clock signal generation circuit and the second internal clock signal transmitted between the internal clock circuit block in which the second feedback signal is obtained and the internal clock signal generation circuit.

The delay circuit generates the second internal clock signal which is delayed from the first internal clock signal based on the phase difference produced by the phase comparison circuit.

Therefore, the phases of the internal clock signals arriving at the internal circuit blocks can be matched. As a result, clock skews between the internal clock signals can be reduced.

In addition, synchronizing the phase of the first internal clock signal with the phase of the external clock signal by the phase locked loop circuit provides an advantage that the phase of the internal clock signal can coincide with the phase of the external clock signal. Furthermore, an internal clock signal having a duty cycle of 50% can be generated irrespective of the duty cycle of the external clock signal. Furthermore, differences in the output timings of the data signals due to temperature and process irregularities can be prevented.

A semiconductor integrated circuit device according to a still further aspect of the invention operates in synchronization with an internal clock signal generated based on an externally input clock signal and includes an internal clock signal generation circuit, a plurality of internal circuit blocks, and a plurality of signal transmission paths.

The internal clock signal generation circuit generates a plurality of internal clock signals of different phases in response to the external clock signal. The plurality of internal circuit blocks operate in synchronization with the plurality of internal clock signals generated by the internal clock signal generation circuit, respectively.

The plurality of signal transmission paths are provided between the internal clock signal generation circuit and the plurality of internal circuit blocks. The plurality of signal transmission paths each transmit an internal clock signal from the internal clock signal generation circuit to a corresponding internal circuit block and each transmit the internal clock signal transmitted to the internal circuit block to the internal clock signal generation circuit as a feedback signal.

Furthermore, the internal clock signal generation circuit includes a phase locked loop circuit, a first phase comparison circuit, a second phase comparison circuit, a phase difference comparison circuit and a delay circuit.

The phase locked loop circuit receives the external clock signal and a first feedback signal among a plurality of feedback signals, and based on a phase difference between these signals synchronizes the phase of a first internal clock signal to be generated with the phase of the external clock signal.

The first phase comparison circuit receives the generated first internal clock signal and the first feedback signal corresponding to the first internal clock signal and compares the phases of these signals to produce a phase difference.

The second phase comparison circuit receives a second internal clock signal among internal clock signals to be generated and a second feedback signal corresponding to the second internal clock signal and compares the phases of these signals to produce a phase difference.

The phase difference comparison circuit compares the phase difference produced by the first phase comparison circuit and the phase difference produced by the second phase comparison circuit to produce a difference between these phase differences.

The delay circuit receives the first internal clock signal and delays the first internal clock signal based on the difference between the phase differences produced by the phase difference comparison circuit to produce the second internal clock signal. The produced second internal clock signal is applied to the second phase comparison circuit and supplied to a corresponding internal circuit block.

As described above, a plurality of internal clock signals of different phases generated by the internal clock signal generation circuit are transmitted to the plurality of internal circuit blocks through the plurality of signal transmission paths, respectively. The internal clock signals transmitted respectively to the internal circuit blocks are transmitted to the internal clock signal generation circuit as feedback signals through the plurality of signal transmission paths.

In the internal clock signal generation circuit, the phase locked loop circuit synchronizes the phase of the first internal clock signal with the phase of the external clock signal based on the phase difference between the external clock signal and the first feedback signal.

The first phase comparison circuit produces the phase difference between the first internal clock signal and the first feedback signal corresponding thereto. The phase difference represents the degree of signal delay between the internal circuit block to which the first internal clock signal is supplied and the internal clock signal generation circuit. The second phase comparison circuit produces the phase difference between the second internal clock signal and the second feedback signal corresponding thereto. The phase difference represents the degree of signal delay between the internal circuit block to which the second internal clock signal is supplied and the internal clock signal generation circuit.

The phase difference comparison circuit produces the difference between the phase differences produced by the first phase comparison circuit and the second phase comparison circuit. The difference between the phase differences represents the difference between the phases of the first internal clock signal and the second internal clock signal arriving at the internal circuit blocks.

The delay circuit generates the second internal clock signal delayed from the first internal clock signal based on the difference between the phase differences produced by the phase difference comparison circuit. The generated second internal clock signal is applied to the second phase comparison circuit and supplied to a corresponding internal circuit block.

More specifically, the second internal clock signal is generated as a signal delayed by the amount of signal delay with respect to the first internal clock signal.

Thus, the phases of the internal clock signals arriving at the internal circuit blocks can be matched. As a result, clock skews between the internal clock signals can be reduced.

In addition, synchronizing the phase of the first internal clock signal with the phase of the external clock signal by the phase locked loop circuit provides another effect that the phase of the internal clock signal can coincide with the phase of the external clock signal. In addition, an internal clock signal having a duty cycle of 50% can be generated irrespective of the duty cycle of the external clock signal. Furthermore, differences in the output timings of data signals due to temperature and process irregularities can be prevented.

A semiconductor integrated circuit device according to a still further aspect of the invention operates in synchronization with internal clock signals generated based on an externally input clock signal and includes an internal clock signal generation circuit, a plurality of internal circuit blocks, and a plurality of signal transmission paths.

The internal clock signal generation circuit generates a plurality of internal clock signals of different phases based on the external clock signal. The plurality of internal circuit blocks operate in synchronization with the plurality of internal clock signals generated by the internal clock signal generation circuit, respectively.

The plurality of signal transmission paths are provided between the internal clock signal generation circuit and the plurality of the internal circuit blocks. The plurality of signal transmission paths each transmit an internal clock signal from the internal clock signal generation circuit to an internal circuit block and each transmit the internal clock signal transmitted to the internal circuit block to the internal clock signal generation circuit as a feedback signal.

The internal clock signal generation circuit further includes a first select circuit, a phase comparison circuit, a voltage control oscillation circuit, a second select circuit, and a selective control circuit.

The first select circuit receives the external clock signal and first and second feedback signals among the plurality of feedback signals, and selectively outputs a first pair of the external clock signal and the first feedback signal or a second pair of the first and second feedback signals.

The phase comparison circuit receives the output signal of the first select circuit, compares the phases of the two signals included in the output signal and outputs a signal indicating a phase difference between them.

The voltage control oscillation circuit generates a first internal clock signal based on the output signal of the phase comparison circuit.

The delay circuit receives the first internal clock signal generated by the voltage control oscillation circuit, delays the first internal clock signal based on the output signal of the phase comparison circuit to produce a second internal clock signal.

The second select circuit is provided between the phase comparison circuit, the voltage control oscillation circuit and the delay circuit and selectively applies the output signal of the phase comparison circuit to the voltage control oscillation circuit or the delay circuit.

The selective control circuit controls the first and second select circuits so that the output signal of the second select circuit is applied to the voltage control oscillation circuit when the first pair of signals are selected by the first select circuit, and controls the first and second select circuits so that the output signal of the second select circuit is applied to the delay circuit, when the second pair of signals are selected by the first select circuit.

As described above, a plurality of internal clock signals of different phases generated by the internal clock signal generation circuit are transmitted to the plurality of internal circuit blocks through the plurality of signal transmission paths, respectively. The internal clock signals transmitted to the internal circuit blocks are transmitted to the internal clock signal generation circuit through the plurality of signal transmission paths as feedback signals.

In the internal clock signal generation circuit, in a first state in which the first pair of signals formed of the external clock signal and the first feedback signal is selected by the first select circuit, a signal indicating the phase difference between the first pair of signals obtained by the phase comparison circuit is applied to the voltage control oscillation circuit through the second select circuit. The first internal clock signal is generated by the voltage control oscillation circuit based on the applied signal. In this case, a phase-locked loop is constituted mainly by the phase comparison circuit and the voltage control oscillation circuit.

Meanwhile, in a second state when the second pair of signals formed of the first feedback signal and the second feedback signal is selected by the first select circuit, a signal indicating the phase difference between the second pair of signals obtained by the phase comparison circuit is applied to the delay circuit through the second select circuit.

When the second internal clock signal, the signal delayed from the first internal clock signal is generated based on the signal indicating the phase difference between the second pair of signals in the first state, using the signal indicating the phase difference between the second pair of signals applied to the delay circuit in the second state, the resultant second internal clock signal is generated as a signal delayed from the first internal clock signal by the amount of the degree of delay of the initial second internal clock signal.

Accordingly, phase differences between the internal clock signals arriving at the plurality of internal circuit blocks, respectively are automatically matched between the internal circuit blocks.

According to the aspect of the invention, based on the states selected by the first select means and second select means controlled by the selective control circuit, the configuration corresponding to the phase locked described above and the configuration corresponding to the phase comparison circuit and the delay circuit are selectively formed.

Thus, the effects the same as those brought about according to the sixth aspect of the invention are provided.

Accordingly, a phase locked loop circuit, a phase comparison circuit and a delay circuit can be used for a plurality of internal clock signals.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Now, embodiments of the present invention will be described in detail in conjunction with the accompanying drawings.

First Embodiment

Figure 1:
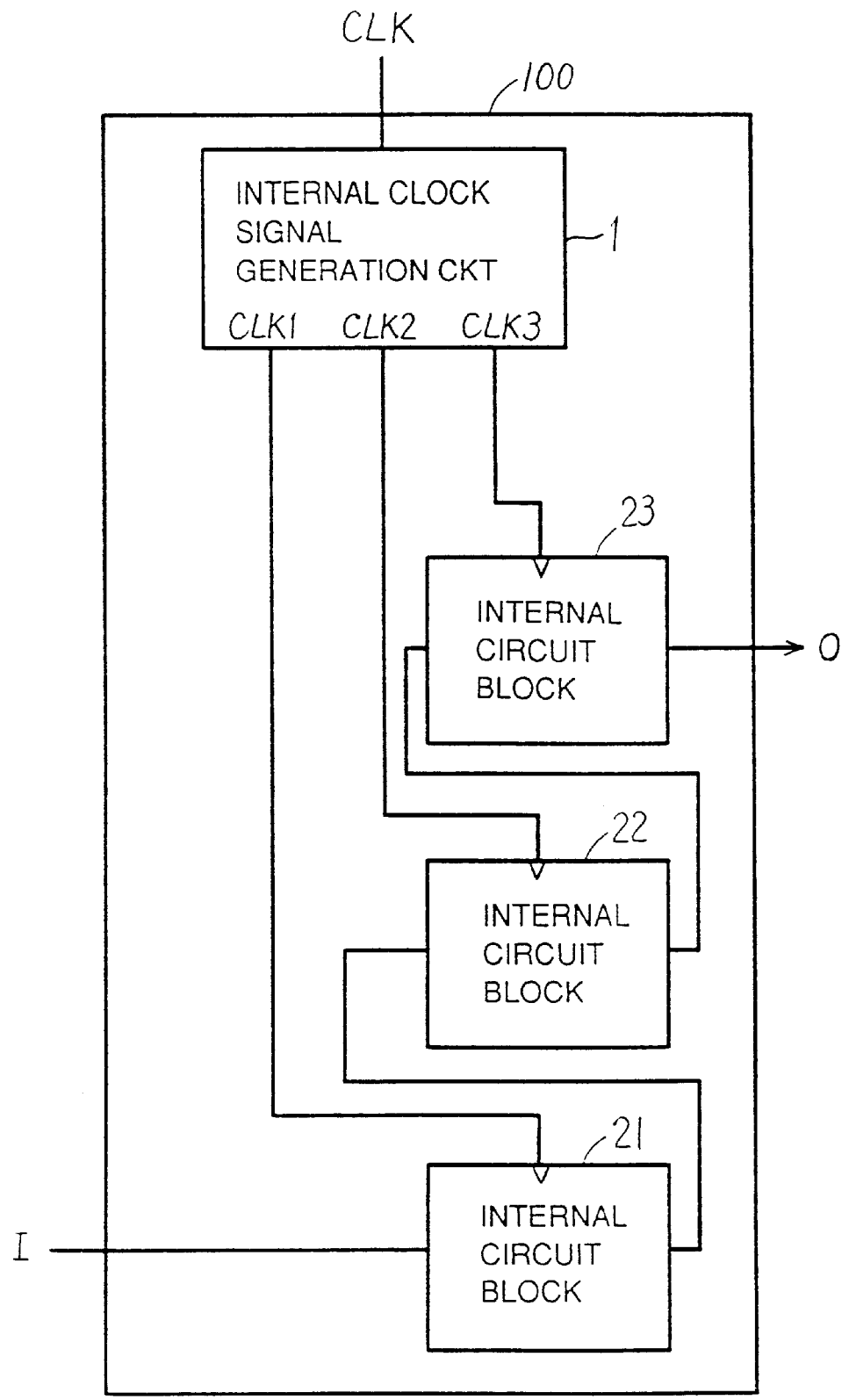
FIG. 1 is a block diagram showing the configuration of an LSI according to a first embodiment.

FIG. 1 is a block diagram showing the configuration of an LSI according to a first embodiment. Referring to FIG. 1, the LSI includes an internal clock signal generation circuit 1, and first, second and third internal circuit blocks 21, 22 and 23 formed on a semiconductor substrate 100.

First, second and third internal circuit blocks 21, 22 and 23 are provided at separate distances from internal clock signal generation circuit 1. For example, first, second and third internal circuit blocks 21, 22, and 23 are located sequentially farther from internal clock signal generation circuit 1.

Internal clock signal generation circuit 1 receives an external clock signal CLK externally applied to the LSI. A first internal clock signal CLK1 is applied to a first internal circuit block 21 from internal clock signal generation circuit 1. A second internal clock signal CLK2 is applied from internal clock signal generation circuit 1 to a second internal circuit block 22. A third internal clock signal CLK3 is applied to a third internal circuit block 23 from internal clock signal generation circuit 1.

First internal circuit block 21 is provided with an externally applied input data signal I. The input data signal I is subjected to a prescribed signal processing in first internal circuit block 21, and a data signal obtained as a result of the signal processing is applied to second internal circuit block 22. The data signal applied to second internal circuit block 22 is subjected to a prescribed signal processing, and a data signal obtained as a result of the signal processing is applied to third internal circuit block 23. The data signal applied to third internal circuit block 23 is subjected to a prescribed signal processing, and a data signal obtained as a result of the signal processing is externally output from the LSI as an output data signal O.

In the LSI, internal clock signal generation circuit 1 generates first, second and third internal clock signals CLK1, CLK2, and CLK3 of different phases based on external clock signal CLK. First internal circuit block 21 operates in synchronization with first internal clock signal CLK1. Second internal circuit block 22 operates in synchronization with second internal clock signal CLK2. Third internal circuit block 23 operates in synchronization with third internal clock signal CLK3.

Figure 2:
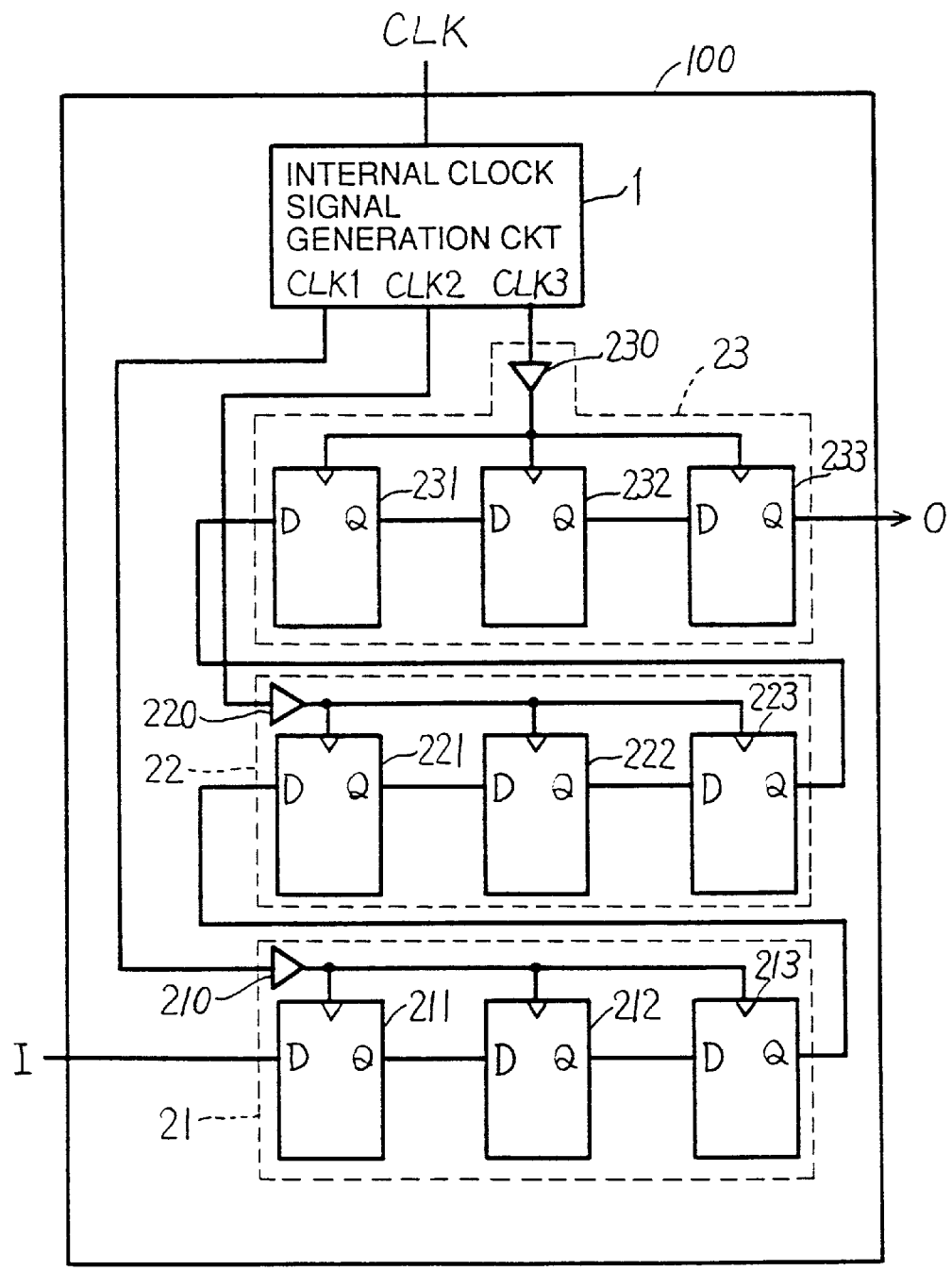
FIG. 2 is a block diagram showing the configuration of an internal circuit block.

Now, the configurations of first, second and third internal circuit blocks 21, 22 and 23 will be described. FIG. 2 is a block diagram showing the configurations of first, second and third internal circuit blocks 21, 22 and 23 in FIG. 1.

Referring to FIG. 2, first internal circuit block 21 includes a clock buffer circuit 210, and cascade-connected three D flipflops 211, 212 and 213. Second internal circuit block 22 includes a clock buffer circuit 220, and cascade-connected three D flipflops 221, 222 and 223. Third internal circuit block 23 includes a clock buffer circuit 230 and cascade-connected three D flipflops 231, 232 and 233.

In first internal circuit block 21, D flipflops 211, 212 and 213 are provided with first internal clock signal CLK1 through clock buffer circuit 210. In second internal circuit block 22, D flipflops 221, 222 and 223 are provided with second internal clock signal CLK2 through clock buffer circuit 220. In third internal circuit block 23, D flipflops 231, 232 and 233 are provided with third internal clock signal CLK3 through clock buffer circuit 230. The data input terminal D of first stage D flipflop 211 in first internal circuit block 21 is provided with an input data signal I.

The data output terminal Q of third stage D flipflop 213 in first internal circuit block 21 is connected to the data input terminal D of first stage D flipflop 211 in second internal circuit block 22. The data output terminal Q of third stage D flipflop 223 in second internal circuit block 22 is connected to the data input terminal D of first stage D flipflop 231 in third internal circuit block 23. Output data signal O is output from the data output terminal Q of third stage D flipflop 233 in third internal circuit block 23.

All the D flipflops included in first, second and third internal circuit blocks 21, 22 and 23 operate in synchronization with the applied internal clock signals.

Figure 3:
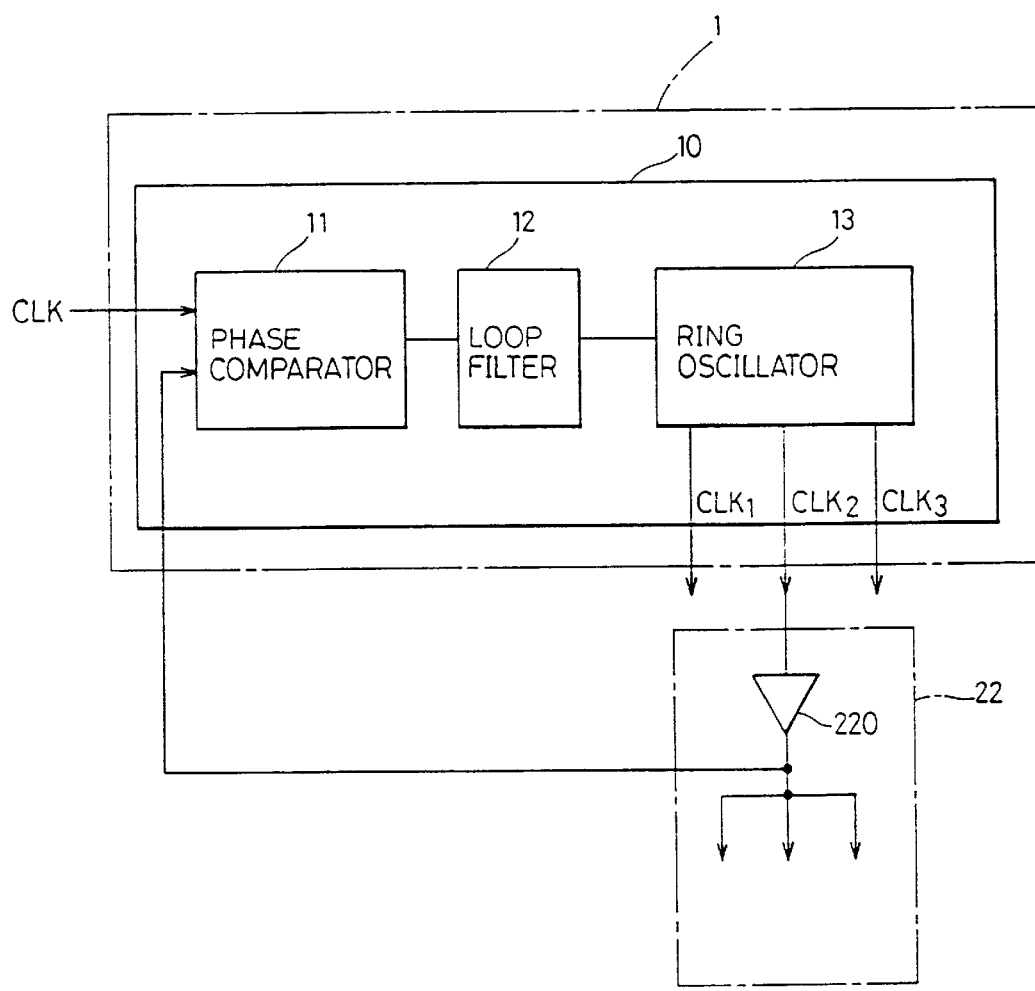
FIG. 3 is a block diagram showing the configuration of an internal clock signal generation circuit.

Now, the configuration of internal clock signal generation circuit 1 in FIG. 1 will be described. FIG. 3 is a block diagram showing the configuration of internal clock signal generation circuit 1. Referring to FIG. 3, internal clock signal generation circuit 1 includes a PLL circuit 10. PLL circuit 10 includes a phase comparator 11, a loop filter 12 and a ring oscillator 13.

Phase comparator 11 is provided with external clock signal CLK and second internal clock signal CLK2 fed back. Second internal clock signal CLK2 is for example fed back from the output side of clock buffer 220 in second internal circuit block 22. Phase comparator 11 compares the phases of the applied external clock signal CLK and second internal clock signal CLK2 and applies a voltage signal according to the phase difference between them to loop filter 12. Loop filter 12 removes a high frequency component of the applied signal and applies the resultant signal to ring oscillator 13.

Ring oscillator 13 generates first, second and third internal clock signals CLK1, CLK2 and CLK3 of different phases in response to the applied signal. The internal clock signals generated by ring oscillator 13 have their frequencies changed in response to the voltage of the signal applied from loop filter 12.

Figure 4:
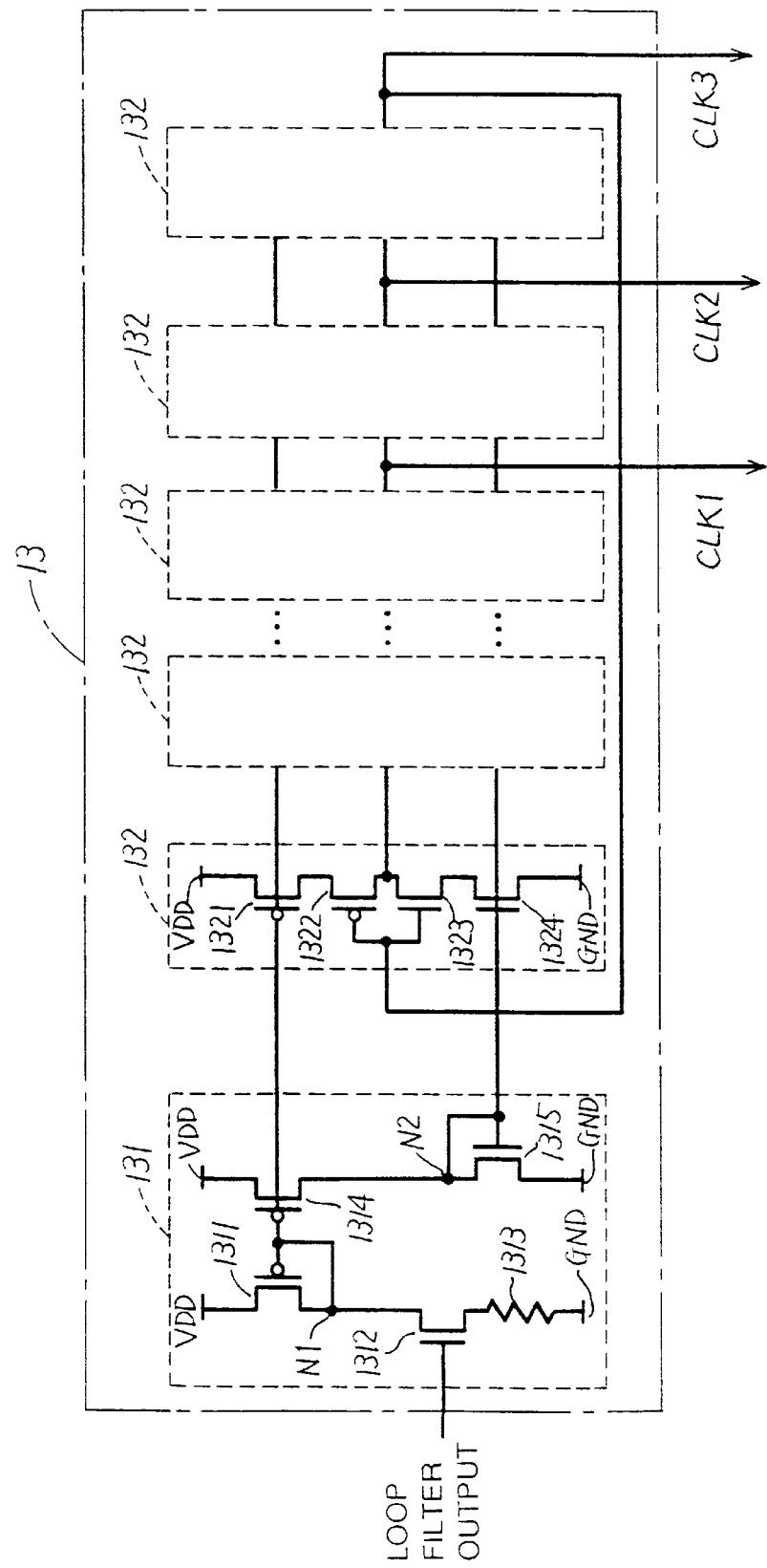
FIG. 4 is a block diagram showing the configuration of a ring oscillator.

Now, the configuration of ring oscillator 13 will be described. FIG. 4 is a block diagram showing the configuration of ring oscillator 13 shown in FIG. 3. Referring to FIG. 4, ring oscillator 13 includes a bias generation circuit 131, and odd number stages of variable delay inverters 132, 132, . . . 132 connected in a loop.

In bias generation circuit 131, a PMOS transistor 1311, an NMOS transistor 1312 and a resistor 1313 are connected in series between a power supply node VDD receiving a power supply potential and a ground node GND receiving a ground potential. A PMOS transistor 1314 and an NMOS transistor 1315 are connected in series between power supply node VDD and ground node GND.

The output signal of loop filter 12 in FIG. 3 is applied to the gate of NMOS transistor 1312. The gates of PMOS transistors 1311 and 1314 are connected to a node N1 between PMOS transistor 1311 and NMOS transistor 1312. The gate of NMOS transistor 1315 is connected to a node N2 between PMOS transistor 1314 and NMOS transistor 1315.

Variable delay inverters 132, 132, . . . have identical configurations. In each of variable delay inverters 132, PMOS transistors 1321 and 1322, and NMOS transistors 1323 and 1324 are connected in series between a power supply node VDD and a ground node GND.

The gate of PMOS transistor 1321 of each variable delay inverter 132 is connected to node N1 between PMOS transistor 1311 and NMOS transistor 1312. The gate of NMOS transistor 1324 in each variable delay inverter 132 is connected to node N2 between PMOS transistor 1314 and NMOS transistor 1315.

The gates of PMOS transistor 1322 and NMOS transistor 1323 in each variable delay inverter 132 are connected to a node between PMOS transistor 1322 and NMOS transistor 1323 in a variable delay inverter 132 in a preceding stage.

Stated differently, the node between PMOS transistor 1322 and NMOS transistor 1323 in each variable delay inverter 132 is connected to the gates of PMOS transistor 1322 and NMOS transistor 1323 in a variable delay inverter 132 in a succeeding stage.

First internal clock signal CLK1 is output from a node between prescribed variable delay inverters 132 and 132 among the odd number stages of variable delay inverters connected in such a loop. Second internal clock signal CLK2 is for example output from a node next to the one from which first internal clock signal CLK1 is output, in other words from a node in a succeeding stage. Third internal clock signal CLK3 is output from a node next to the node from which second internal clock signal CLK2, is output in other words from a node in a succeeding stage.

Now, the operation of ring oscillator 13 will be described. In each variable delay inverter 132, PMOS transistor 1322 and NMOS transistor 1323 act as a delay inverter. Thus, waveforms of clock signals appear on signal lines between variable delay inverters 132, 132, . . .

The frequency of such a clock signal is varied based on the magnitude of voltage applied to the gates of PMOS transistor 1321 and NMOS transistor 1324. More specifically, the frequency of the clock signal is varied based on the magnitude of voltage of the output signal of bias generation circuit 131.

In bias generation circuit 131, when the voltage of the signal applied from loop filter 12 increases, the on resistance of NMOS transistor 1312 decreases and voltage at node N1 decreases. Therefore, the gate voltages of PMOS transistors 1311, 1314 and 1321 decrease. When the gate voltage of PMOS transistor 1314 decreases, the on resistance of PMOS transistor 1314 decreases and voltage at node N2 increases.

The decrease of the gate voltage of PMOS transistor 1321 and the increase of the gate voltage of NMOS transistor 1324 increase a driving capability for transistors constituting variable delay inverter 132. As a result, the operation speed of variable delay inverter 132 increases, and the frequencies of first, second and third internal clock signals CLK1, CLK2 and CLK3 become higher.

Conversely, the decrease of voltage applied from loop filter 12 to the gate of NMOS transistor 1312 decreases a driving capability for transistors constituting variable delay inverter 132. As a result, the operation speed of variable delay inverter 132 is lowered, and the frequencies of first, second and third internal clock signals CLK1, CLK2 and CLK3 generated in ring oscillator 13 are lowered.

Now, the overall operation of the LSI according to the first embodiment will be described. First, second and third internal clock signals CLK1, CLK2 and CLK3 generated by internal clock signal generation circuit 1 are applied to first, second and third internal circuit blocks 21, 22 and 23, respectively.

In each of first, second and third internal circuit blocks 21, 22 and 23, each D flipflop operates in synchronization with an applied internal clock signal. By an operation of each D flipflop, first, second and third internal circuit blocks 21, 22, 23 allow input data to be received at first internal circuit block 21, while by an operation of a D flipflop in each internal circuit block, input data signal I is subjected to a signal processing for output from third internal circuit block 23 as output data signal O.

In such operations, each of D flipflops 211 to 233 operates as follows.

Figure 5:
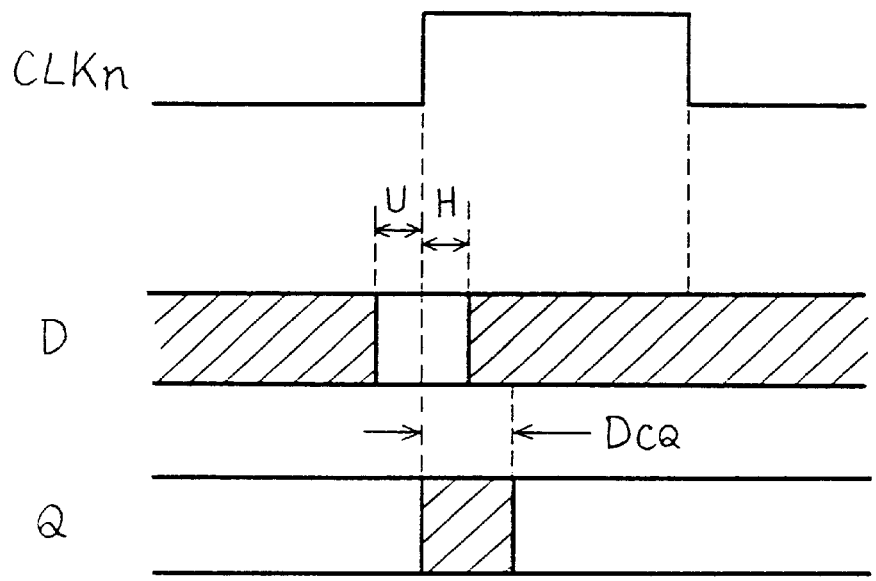
FIG. 5 is a timing chart for use in illustration of the operation of a D flipflop.

FIG. 5 is a timing chart for use illustration of the operation of a D flipflop. Set forth in FIG. 5 are internal clock signal CLKn, data signal D input to the D flipflop, and data signal Q output from the D flipflop. Shadowed portions in FIG. 5 are data don't care periods.

Referring to FIG. 5, the D flipflop requires setup time U and hold time H before and after a rising edge of internal clock signal CLKn. Output data signal Q becomes valid data after the elapse of a prescribed time period DCQ from the rising edge of internal clock signal CLKn.

Now, an operation of the D flipflop when a skew of an internal clock signal is generated between internal circuit blocks will be described.

Figure 6:
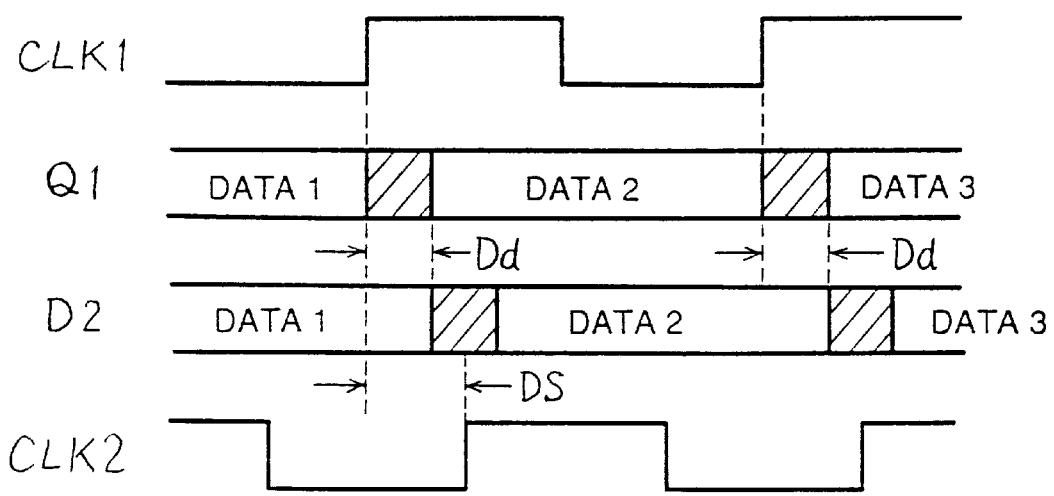
FIG. 6 is a timing chart for use in illustration of the operation of a D flipflop when a clock skew is generated in an internal clock signal.

FIG. 6 is a timing chart for use in illustration of an operation of the D flipflop when a clock skew is generated in an internal clock signal. FIG. 6 includes first internal clock signal CLK1, second internal clock signal CLK2, data signal Q1 output from D flipflop 213 in the output stage of first internal circuit block 21 and data signal D2 input to D flipflop 221 in the input stage of second internal circuit block 22. Also in FIG. 6, shadowed portions are data don't care periods.

FIG. 6 corresponds to the case in which a clock skew DS between first internal clock signal CLK1 and second internal clock signal CLK2 is larger than a delay Dd between data signals between D flipflop 213 and D flipflop 221.

Referring to FIG. 6, when clock skew DS is larger than the delay Dd between the data signals, flipflop 221 receiving data signal D2 might receive the applied data signal D2 in the data don't care period of data signal D2. A solution to this problem is to advance the phase of second internal clock signal CLK2 until clock skew DS is smaller than delay Dd between the data signals.

A description of the overall operation of the LSI follows. In the LSI according to the first embodiment, first, second and third internal circuit blocks 21, 22 and 23 are located sequentially farther from internal clock signal generation circuit 1, and therefore the phases of internal clock signals are made different for the amount of the clock skew in order to eliminate such a clock skew generated for the distances. More specifically, as illustrated in FIG. 7, the phases of generated internal clock signals are previously set differently.

Figure 7:
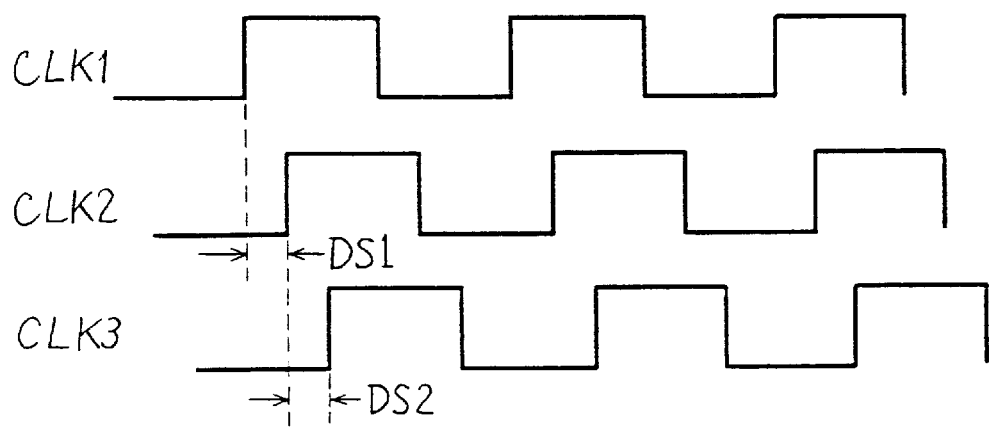
FIG. 7 is a timing chart for internal clock signals generated in an internal clock signal generation circuit.

FIG. 7 is a timing chart for use in illustration of first, second and third internal clock signals CLK1, CLK2 and CLK3 generated in internal clock signal generation circuit 1. Referring to FIG. 7, first internal clock signal CLK1 is generated as a signal having a phase advanced from second internal clock signal CLK2 by the amount of clock skew DS1 between them. Third internal clock signal CLK3 is generated as a signal having a phase delayed from second internal clock signal CLK2 by the amount of clock skew DS2 between them.

Figure 8:
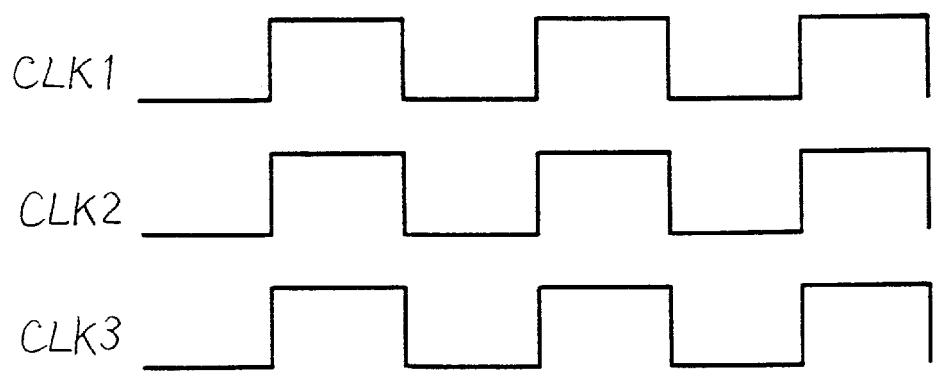
FIG. 8 is a timing chart for internal clock signals arriving at an internal circuit blocks.

The phases as illustrated in FIG. 8 are attained when internal clock signals CLK1, CLK2, and CLK3 in FIG. 7 arrive at first, second and third internal circuit blocks 21, 22 and 23.

FIG. 8 is a timing chart for use in illustration of internal clock signals CLK1, CLK2 and CLK3 arriving at internal circuit blocks 21, 22 and 23. Referring to FIG. 8, since internal clock signals CLK1, CLK2 and CLK3 have their phases previously set different by amounts of clock skews generated between the clock signals, their phases coincide upon arriving at internal circuit blocks 21, 22 and 23. In the LSI according to the first embodiment, clock skews of internal clock signals are eliminated.

In addition, in the LSI according to the first embodiment, internal clock signal generation circuit 1 generates internal clock signals with PLL circuit 10, and therefore the following effects are obtained.

The phase locking function of PLL circuit 10 synchronizes the phases of internal clock signals CLK1, CLK2 and CLK3 arriving at internal circuit blocks 21, 22 and 23, respectively with the phase of external clock signal CLK. Since in PLL circuit 10, ring oscillator 13 generates internal clock signals CLK1, CLK2 and CLK3, an internal clock signal having a duty cycle of 50% can be produced even if the external clock signal CLK does not have a normal duty cycle of 50%.

Second Embodiment

Figure 9:
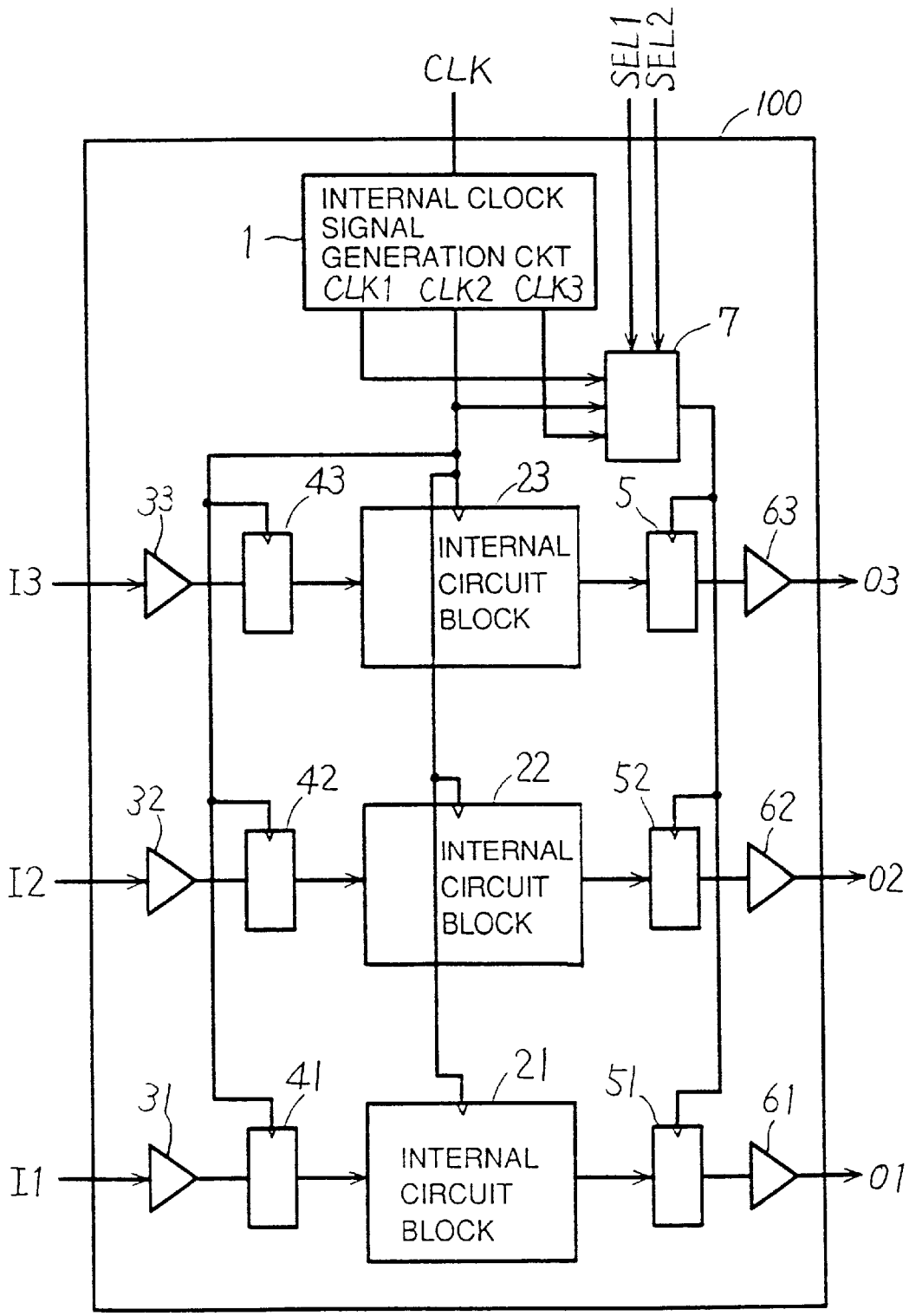
FIG. 9 is a block diagram showing the configuration of an LSI according to a second embodiment.
Figure 21:
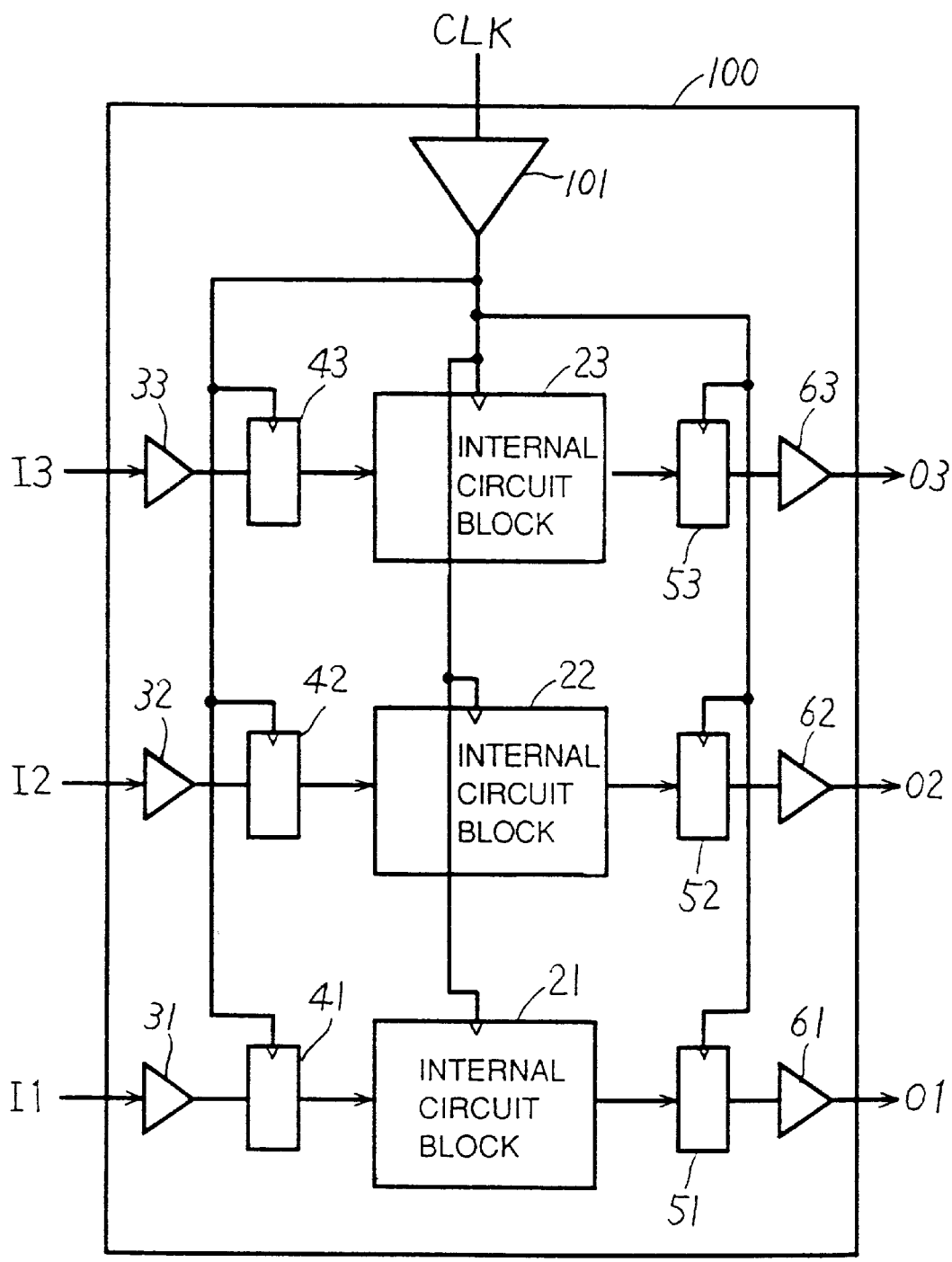
FIG. 21 is a block diagram showing an LSI by way of illustrating a conventional semiconductor integrated circuit device.
Figure 22:
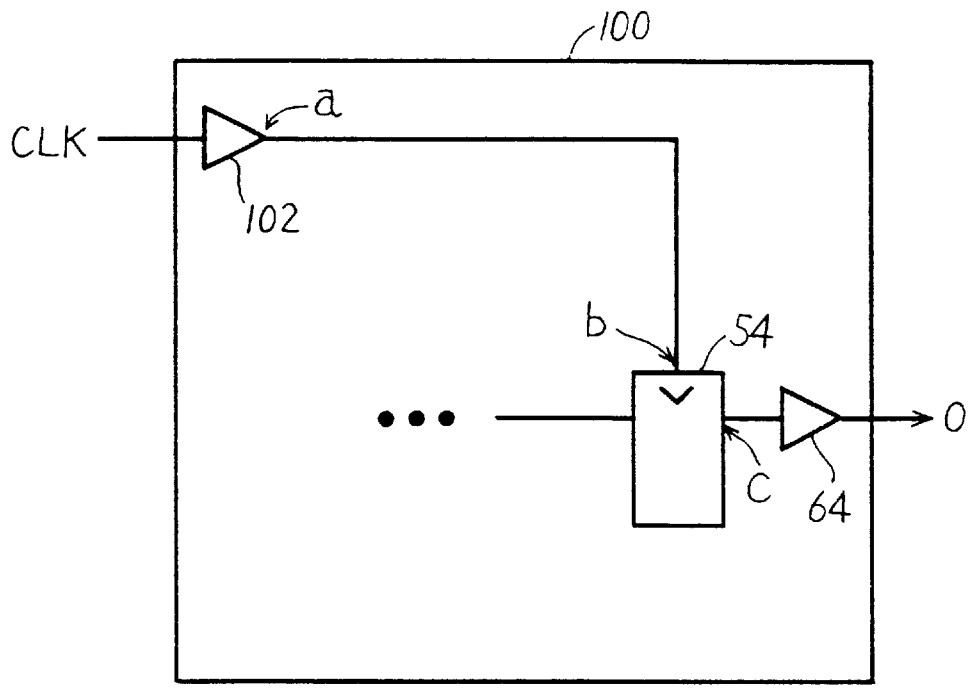
FIG. 22 is a block diagram showing some of transmission paths for a clock signal and a data signal in a conventional LSI.

Now, a second embodiment will be described. FIG. 9 is a block diagram showing the configuration of an LSI according to the second embodiment. The LSI in FIG. 9 is different from the LSI in FIG. 21 in that internal clock signal generation circuit 1 and a selector 7 are provided.

Second internal clock signal CLK2 of internal clock signals generated in internal clock signal generation circuit 1 is applied to input latch circuit 41, 42 and 43 and internal circuit blocks 21, 22 and 23.

Selector 7 is provided with internal clock signals CLK1, CLK2 and CLK3 from internal clock signal generation circuit 1 and first and second select signals SEL1 and SEL2. One of internal clock signals CLK1, CLK2 and CLK3 is selectively applied to output latch circuits 51, 52 and 53 from selector 7 based on first and second select signals SEL1 and SEL2.

Figure 10:
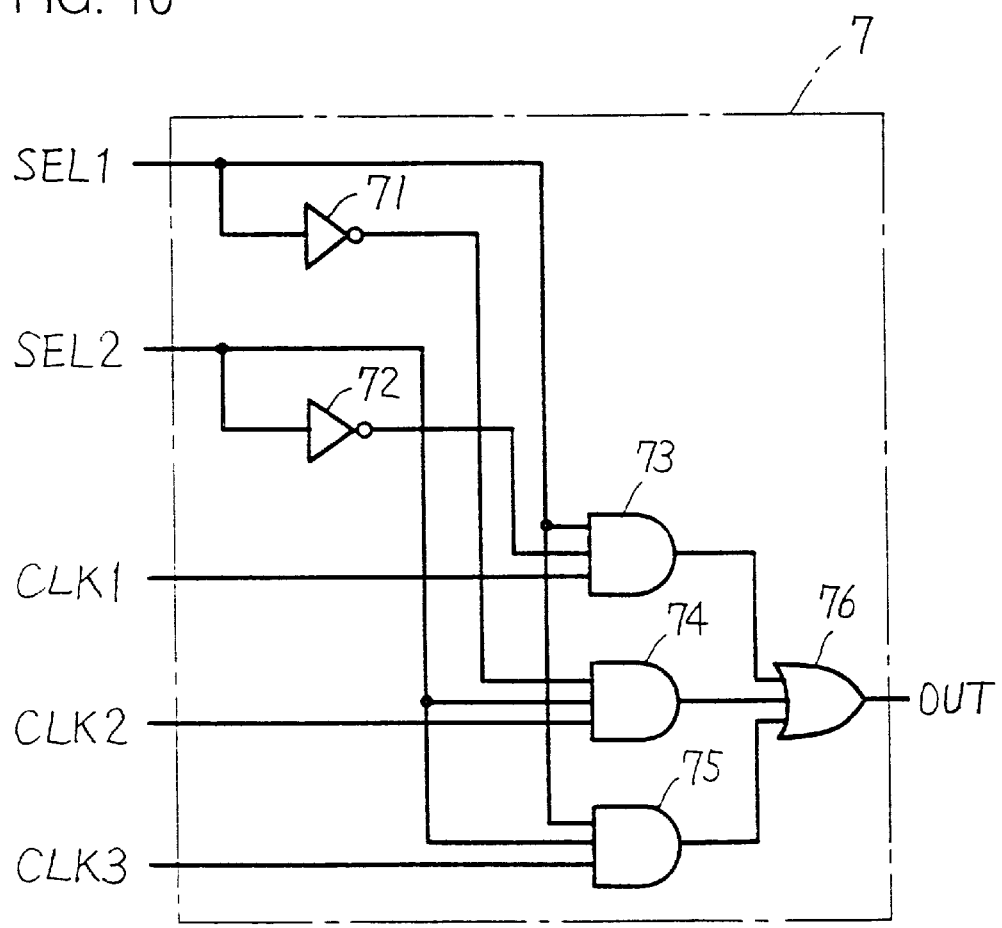
FIG. 10 is a block diagram showing the configuration of a selector.

Now, the configuration of selector 7 will be described. FIG. 10 is a block diagram showing the configuration of selector 7. Referring to FIG. 10, selector 7 includes two inverters 71 and 72, and three AND gates 73, 74 and 75, and one OR gate 76.

AND gate 73 is provided with first select signal SEL1, second select signal SEL2 inverted by inverter 72, and first clock signal CLK1. AND gate 74 is provided with first select signal SEL1 inverted by inverter 71, second select signal SEL2, and second internal clock signal CLK2.

AND gate 75 is provided with first select signal SEL1, second select signal SEL2 and third internal clock signal CLK3. The output signals of AND gates 73, 74 and 75 are output through OR gate 76.

Now, the operation of selector 7 will be described. When first select signal SEL1 is at a high level and second select signal SEL2 is at a low level, first internal clock signal CLK1 is output from AND gate 73 through OR gate 76. When first select signal SEL1 is at a low level and second select signal SEL2 is at a high level, second internal clock signal CLK2 is output from AND gate 74 through OR gate 76. When first select signal SEL1 and second select signal SEL2 are both at a high level, third internal clock signal CLK3 is output from AND gate 75 through OR gate 76.

The configurations of output latch circuits 51, 52 and 53 receiving the output signal of selector 7 will be described. These output latch circuits have identical configurations. Input latch circuits 41, 42 and 43 have identical configurations to output latch circuits 51, 52 and 53.

Figure 11:
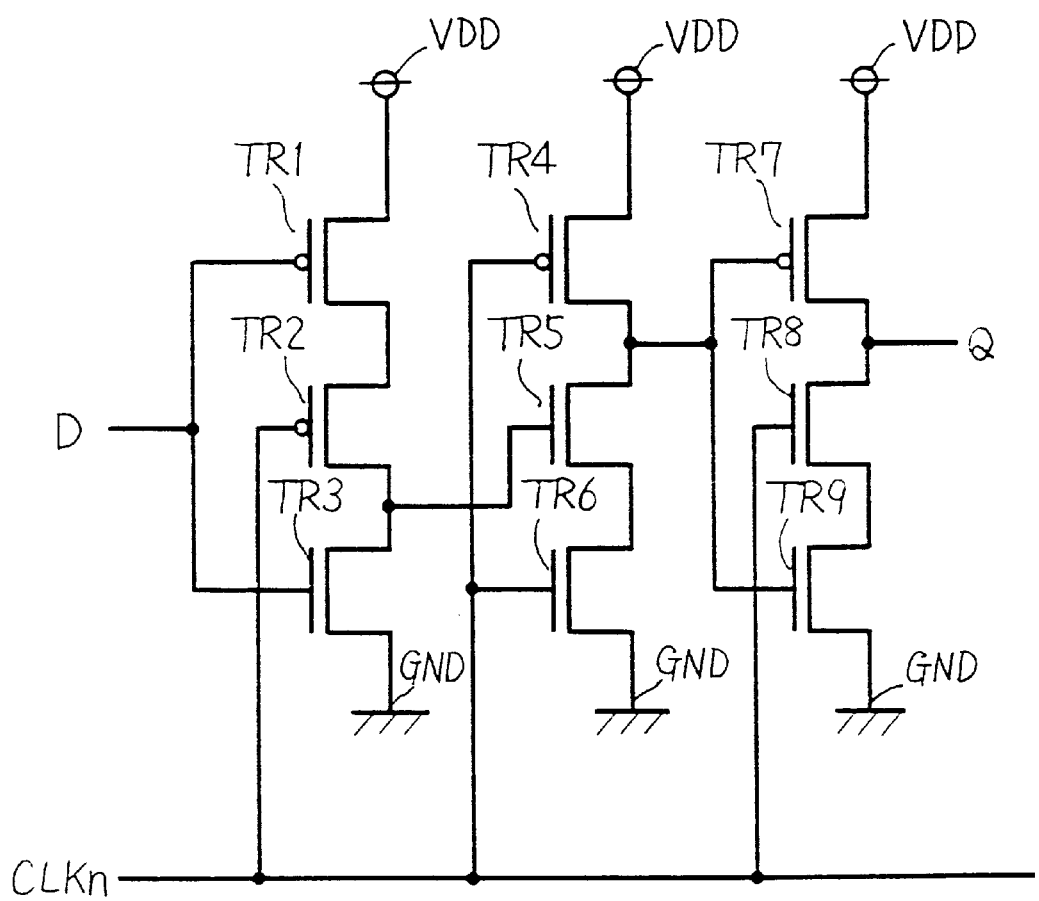
FIG. 11 is a circuit diagram showing the configuration of a circuit used for an output latch circuit or input latch circuit.

FIG. 11 is a circuit diagram showing the configuration of one output latch circuit/input latch circuit. Referring to FIG. 11, the latch circuit includes four PMOS transistors TR1, TR2, TR4 and TR7, and five NMOS transistors TR3, TR5, TR6, TR8 and TR9.

Transistors TR1, TR2 and TR3 are connected in series between a power supply node VDD and a ground node GND. Transistors TR4, TR5 and TR6 are connected in series between a power supply node VDD and a ground node GND. Transistors TR7, TR8 and TR9 are connected in series between a power supply node VDD and ground node GND. A node between transistors TR2 and TR3 is connected to the gate of transistor TR5.

A node between transistors TR4 and TR5 is connected to the gates of transistors TR7 and TR9. Transistors TR2, TR4, TR6 and TR8 are provided with internal clock signal CLKn at their gates. Transistors TR1 and TR3 are provided with input data signal D at their gates. Data signal Q is output from a node between transistors TR7 and TR8.

More specifically, the latch circuit is a D flipflop. Accordingly, the latch circuit operates in the same manner as the operation according to the timing chart shown in FIG. 5.

Now, the overall operation of the LSI according to the second embodiment will be described. Note that portions in common with the LSI in FIG. 21 will not be described here.

Selector 7 selects an internal clock signal to be output in response to select signal SEL1 or SEL2. The internal clock signal selected by selector 7 is applied to output circuits 51, 52 and 53. Output latch circuits 51, 52 and 53 operate in synchronization with the applied internal clock signal.

In the LSI, the internal clock signal applied to output latch circuits 51, 52 and 53 varies in response to select signals SEL1 and SEL2, output timings for output data signals O1, O2 and O3 to be output externally from the LSI through output buffer circuits 61, 62 and 63 from output latch circuits 51, 52 and 53 can be varied.

Thus, with a variable output timing for an output data signal, the following effects are brought about.

Figure 12:
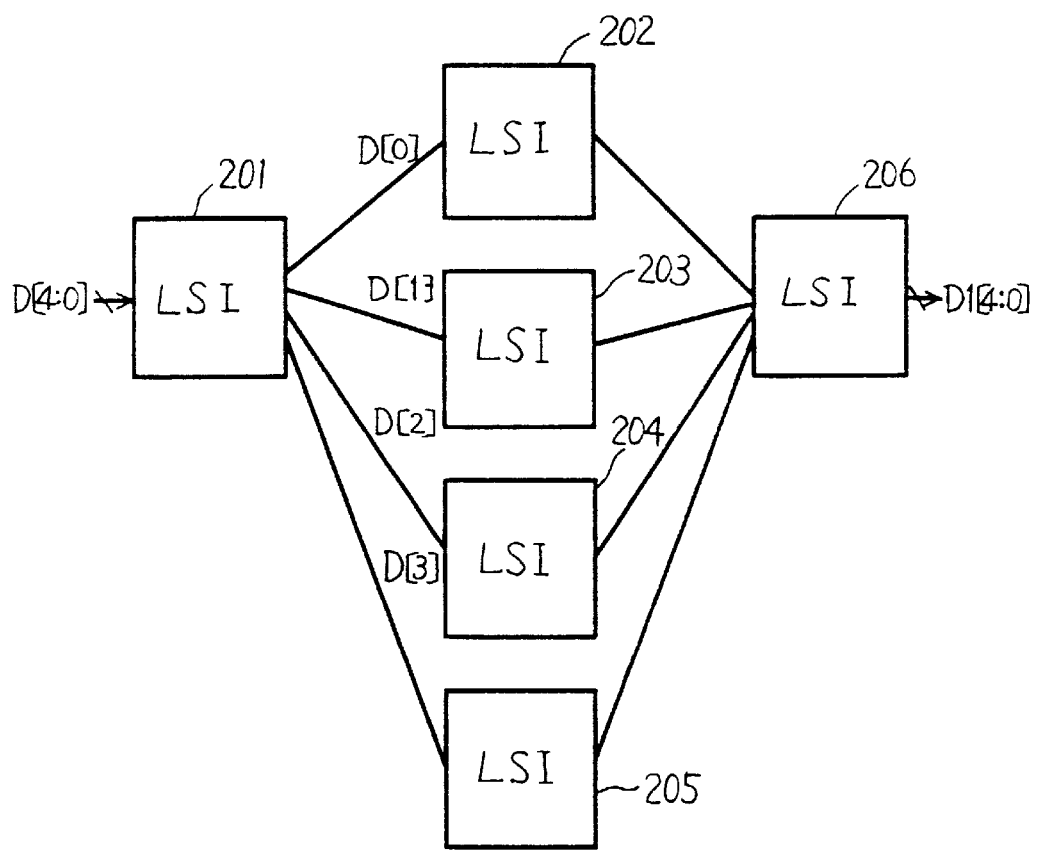
FIG. 12 is a block diagram showing the configuration of a system for transmitting/receiving data signals between a plurality of LSIs and one LSI.

FIG. 12 is a block diagram showing the configuration of a system for transmitting/receiving data signals between a plurality of LSIs and one LSI. Referring to FIG. 12, in this system, first LSI 201 and second to fifth LSIs 202 to 205 are connected, and second to fifth LSIs 202 to 205 are connected to sixth LSI 206.

In operation, first LSI 201 receives 4-bit data D [4:0]. The received data D [4:0] is applied to first to fifth LSIs 201 to 205 on a 1 bit basis. Second to fifth LSIs 202 to 205 each conduct a prescribed operation to the received data on the one bit basis, and each apply a data signal representing the result of the processing to sixth LSI 206. Sixth LSI 206 receives data on the 1 bit basis and outputs the data as 4 bit D1 [4:0].

In such a system, sixth LSI 206 must receive the data applied from second to fifth LSIs 202 to 205 at a time. In such a case, data applied from second to fifth LSIs 202 to 205 must arrive at sixth LSI 206 at a time. If, however, degrees of delays are different between the data applied to sixth LSI 206 and the data is output from second to fifth LSI 202 to 205 at a time, these pieces of data do not arrive at sixth LSI 206 at a time.

In the LSI according to the second embodiment, since the output timing for the output data signal of the LSI is variable, use of such LSIs for second to fifth LSIs 202 to 205 in the system shown in FIG. 12 provides different output timings for second to fifth LSI 202 to 205.

Accordingly, if output timings for second to fifth LSIs 202 to 205 are set differently based on degrees of delays between second to fifth LSIs 202 to 205 and sixth LSI 206, the data output from second to fifth LSIs 202 to 205 can arrive at sixth LSI 206 at a time.

Figure 23:
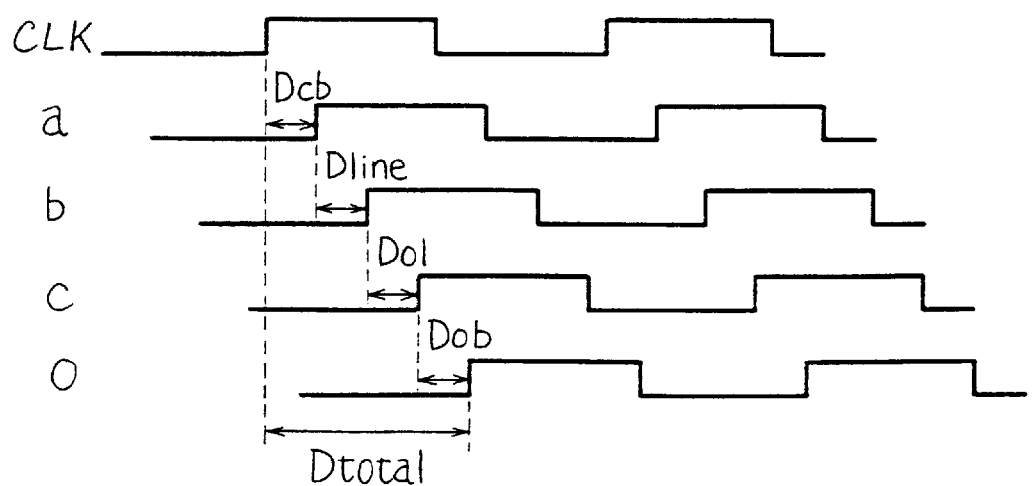
FIG. 23 is a waveform chart for signals at elements in the LSI in FIG. 22.
Figure 24:
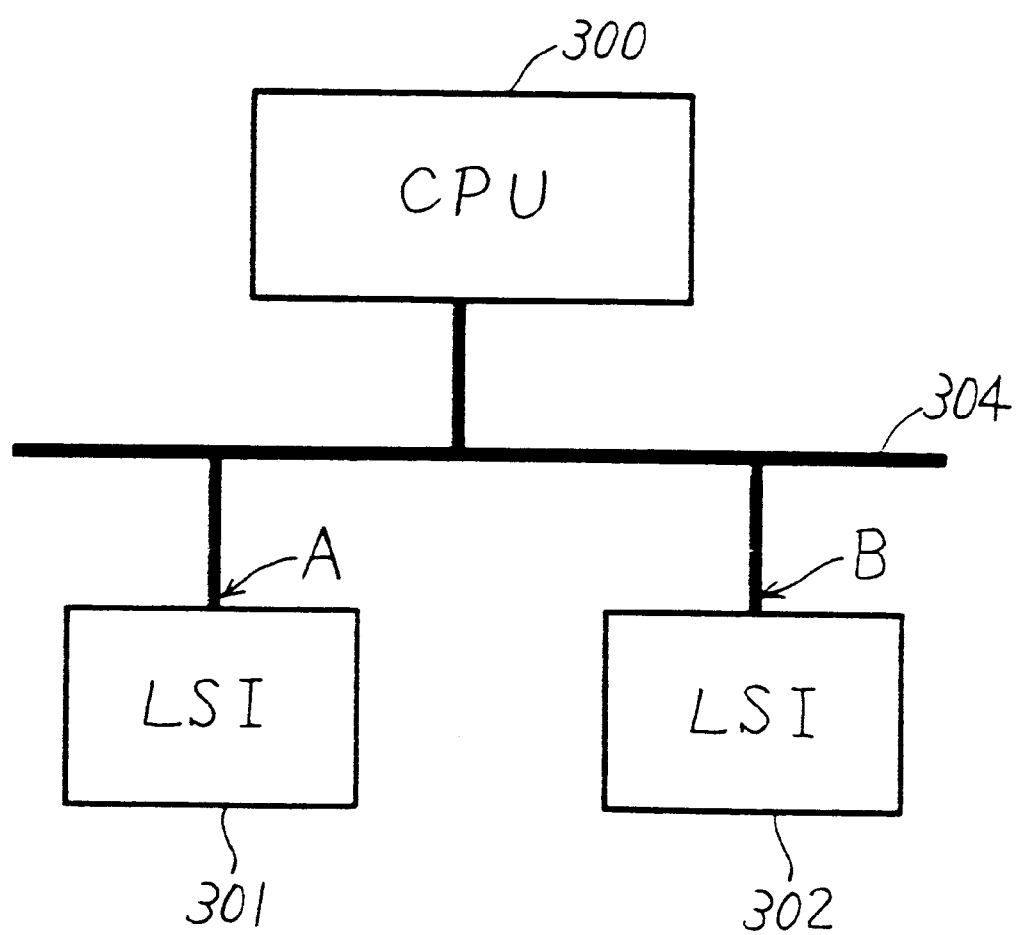
FIG. 24 is a block diagram showing an arrangement of a CPU and a plurality of LSIs which operates in synchronization with a common system clock signal.
Figure 25:
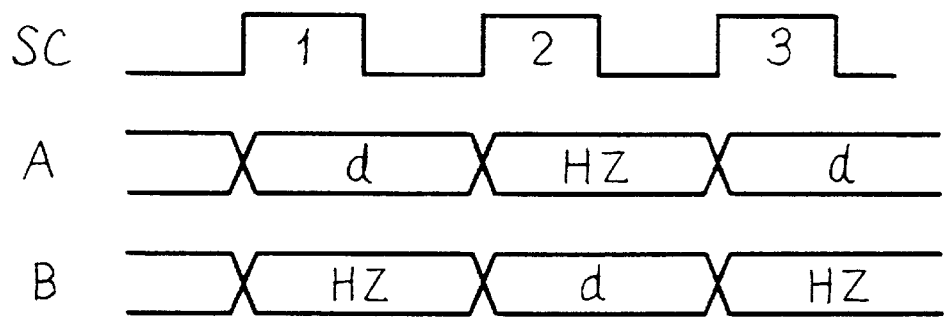
FIG. 25 is a timing chart for use in illustration of a normal operation state in the system in FIG. 24.
Figure 26:
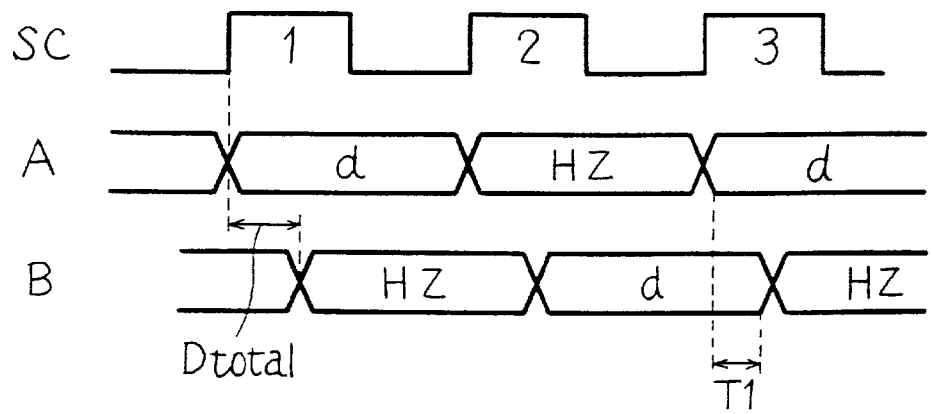
FIG. 26 is a timing chart for use in illustration of an abnormal operation state in the system in FIG. 24.
Figure 27:
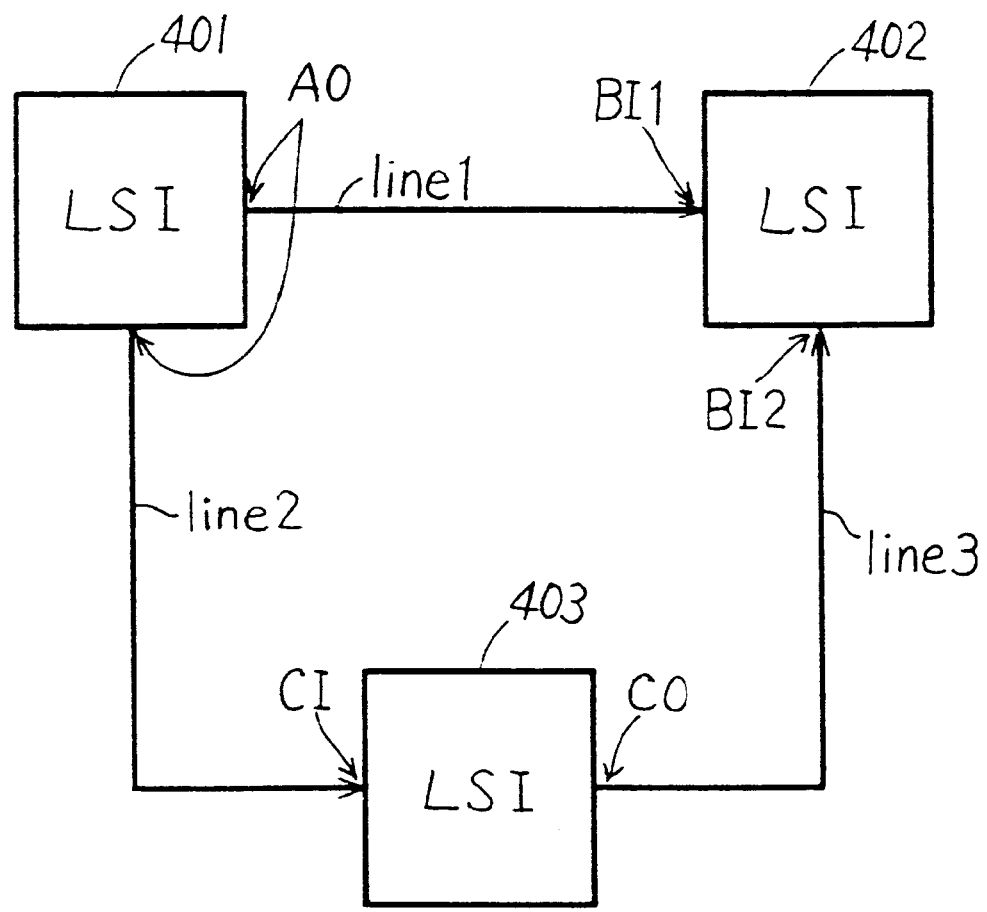
FIG. 27 is a block diagram showing a system for transmitting/receiving data signals between at least three LSIs.
Figure 28:
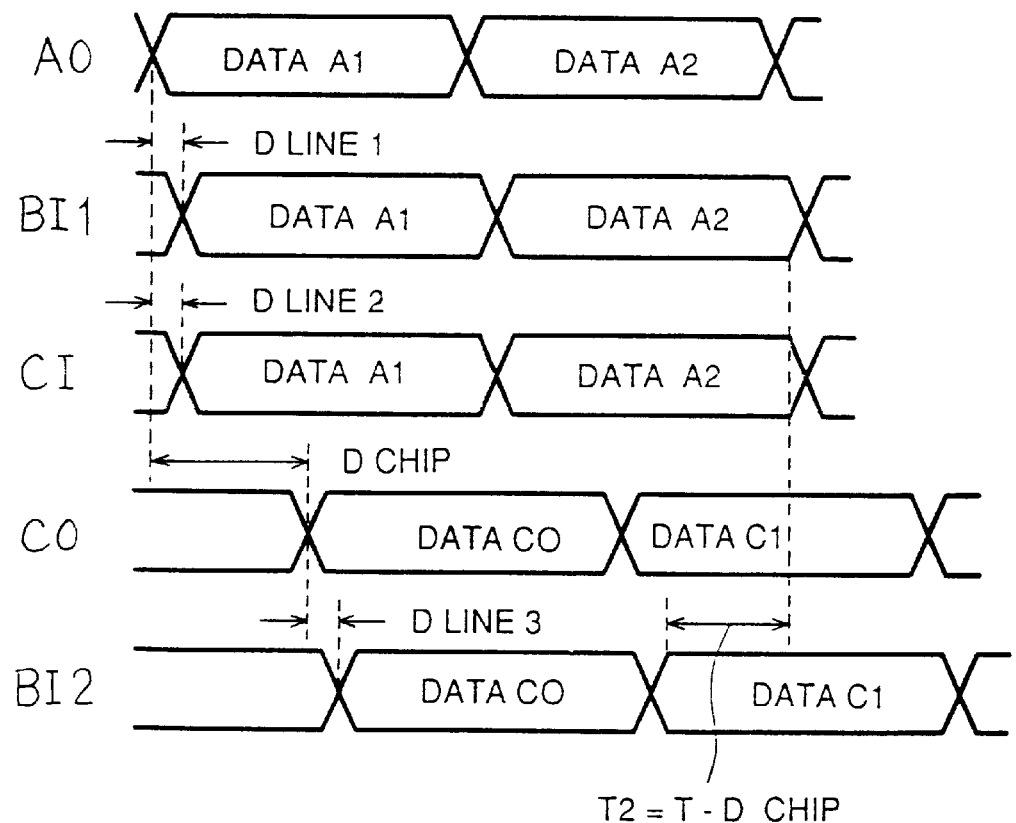
FIG. 28 is a timing chart for use in illustration of the operation of the system in FIG. 27.

In addition, the following effect is obtained as well in the LSI according to the second embodiment. As described above, the phase of the internal clock signal applied to output latch circuits 51, 52 and 53 are synchronized with the phase of the external clock signal CLK. Therefore, delay Dtotal (see FIG. 23) for the output timings for output data signals O1, O2 and O3 with respect to the input timing of the external clock signal CLK is only delay Dob (see FIG. 23) by output buffer circuits 61, 62 and 63.

Accordingly, delays of output data signals can readily be estimated at the time of designing the system. Therefore, such delays of the output data signals do not have to be readjusted after the LSI is packaged.

Third Embodiment

Figure 13:
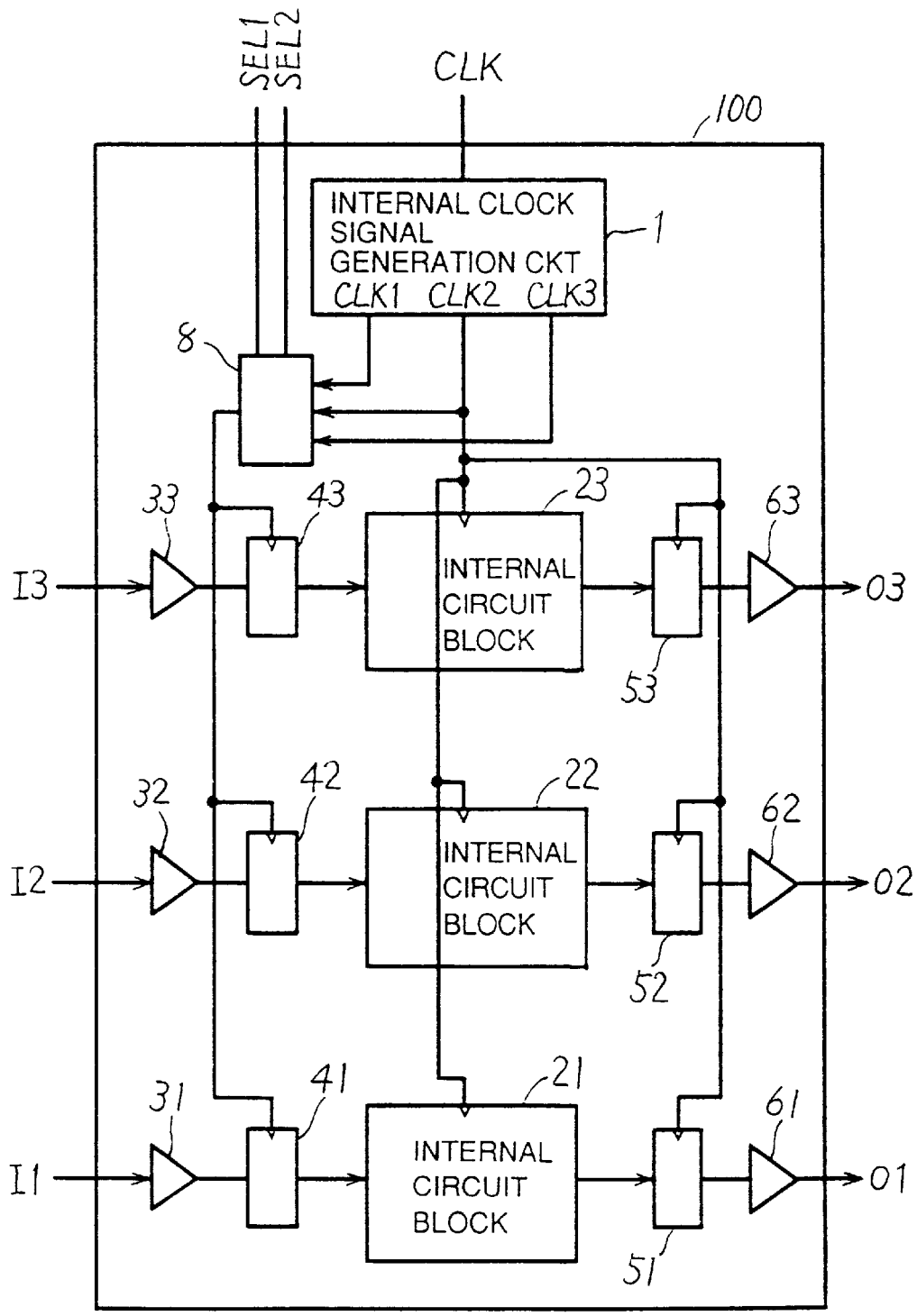
FIG. 13 is a block diagram showing the configuration of an LSI according to a third embodiment.

Now, a third embodiment will be described. FIG. 13 is a block diagram showing the configuration of an LSI according to the third embodiment. The LSI in FIG. 13 is different from the LSI in FIG. 21 in that internal clock signal generation circuit 1 and selector 8 are provided.

Second internal clock signal CLK2 among the internal clock signals generated in internal clock signal generation circuit 1 is applied to output latch circuits 51, 52 and 53, and internal circuit blocks 21, 21 and 23.

Selector 8 is provided with internal clock signals CLK1, CLK2 and CLK3 from internal clock signal generation circuit 1, and first and second select signals SLE1 and SLE2. Input latch circuits, 41, 42 and 43 are selectively provided with one of internal clock signals CLK1, CLK2 and CLK3 from selector 8 based on select signals SEL1 or SEL2. The configuration of selector 8 is the same as the circuit shown in FIG. 10.

Now, the overall operation of the LSI according to the third embodiment will be described. Note that portions in common with the LSI in FIG. 21 will not be described here.

In selector 8, an internal clock signal for output is selected in response to select signal SEL1 or SEL2. The internal clock signal selected by selector 8 is applied to input latch circuits, 41, 42 and 43. Input latch circuits 41, 42 and 43 operate in synchronization with the applied internal clock signal.

In the LSI, the internal clock signal to be applied to input latch circuit 41, 42 and 43 varies in response to select signals SEL1 and SEL2. Accordingly, timings for receiving input data signals I1, I2 and I3 received by input latch circuits 41, 42 and 43 through input buffer circuits 31, 32 and 33 can be varied.

With such a variable timing for an input data signal, the following effect is obtained. Referring to FIG. 12, in the system shown in FIG. 12, since separate delays are present between first LSI 201 and respective second to fifth LSIs 202 to 205, data does not arrive at LSIs 202 to 205 at a time. If timings for receiving input data are the same for LSIs 202 to 205 in such a case, some of the LSIs might not be able to receive data.

Since the LSI according to the third embodiment has a variable timing for receiving an input data signal, use of such LSIs for LSIs 202 to 205 in the system in FIG. 12 can set different timings for receiving input data signals at LSIs 202 to 205. Accordingly, setting different timings for receiving input signals at LSIs 202 to 205 depending upon degrees of delays between LSI 201 and respective LSIs 202 to 205 makes it possible for all the LSIs 202 to 205 to receive input signals.

Fourth Embodiment

Figure 14:
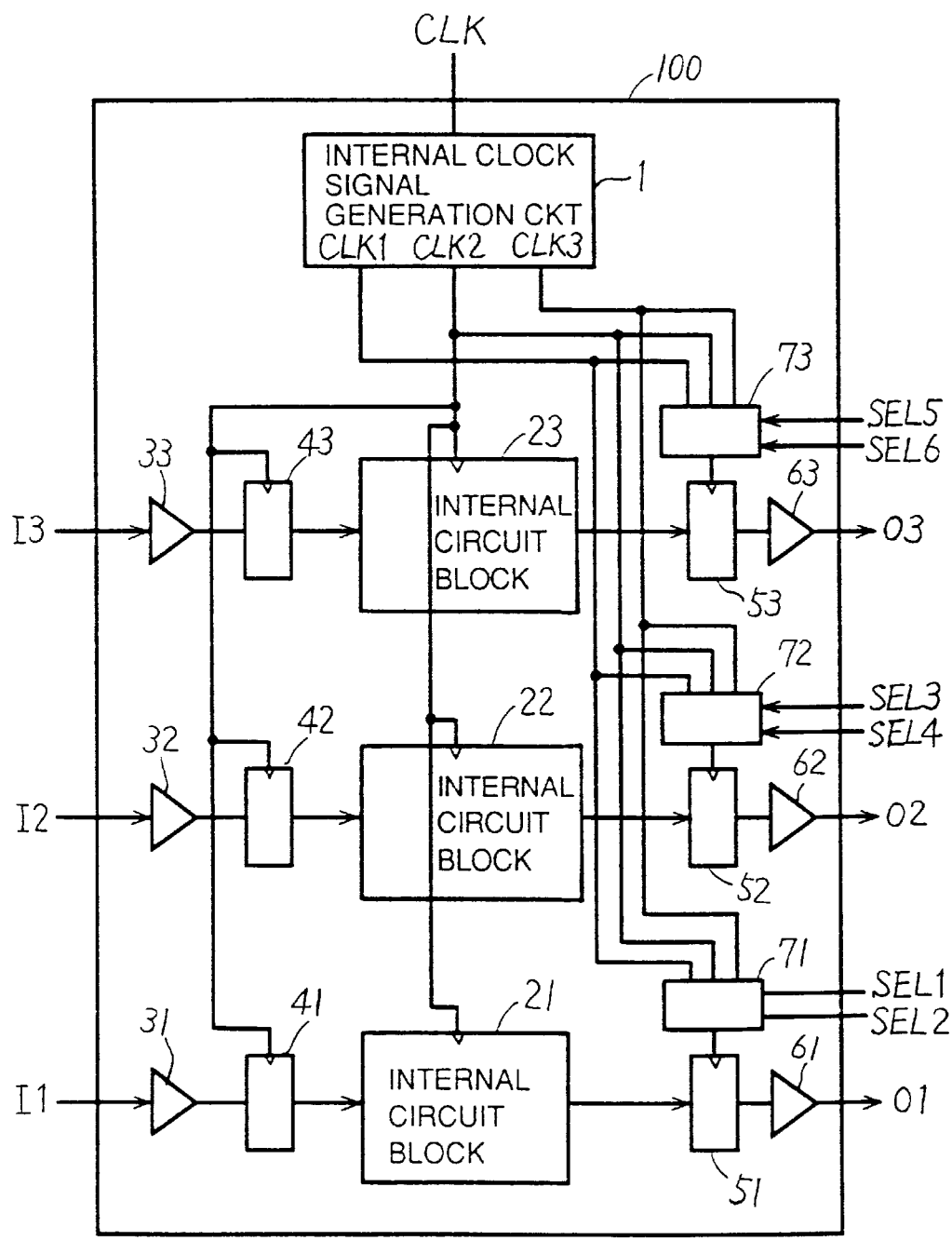
FIG. 14 is a block diagram showing the configuration of an LSI according to a fourth embodiment.

A fourth embodiment will be described. FIG. 14 is a block diagram showing the configuration of an LSI according to the fourth embodiment. The LSI in FIG. 14 is different from the LSI in FIG. 9 in that selectors 71, 72 and 73 are provided corresponding to output latch circuits 51, 52 and 53. The configuration of each of selectors 71, 72 and 73 is the same as the selector shown in FIG. 10.

Now, the overall operation of the LSI according to he fourth embodiment will be described. Note that portions in common with the LSI in FIG. 9 will not be described here.

In selector 71, an internal clock signal for output is selected in response to select signal SEL1 and SEL2. The internal clock signal selected by selector 71 is applied to output latch circuit 51.

In selector 72, an internal clock signal for output is selected in response to select signal SEL3 and SEL4. The internal clock signal selected by selector 72 is applied to output latch circuit 52.

In selector 73, an internal clock signal for output is selected in response to select signal SEL5 and SEL6. The internal clock signal selected by selector 73 is applied to output latch circuit 53. Output latch circuits 51, 52 and 53 operate in synchronization with the applied internal clock signal.

In this LSI, in each of output latch circuits 51, 52 and 53, the internal clock signal to be applied is changed in response to a select signal for every output latch circuit. Accordingly, output timings for output data signals O1, O2 and O3 output externally from the LSI through output buffer circuits 61, 62 and 63 from output latch circuits 51, 52 and 53 can be changed for every output data signal.

Therefore, with such a variable output timing for every output data signal, the following effect is obtained in addition to the effect described in conjunction with the second embodiment. Since the output timing is variable for every output data signal, output data signals O1, O2 and O3 can be output in different timings. As a result, simultaneous switching noises in LSIs can be eliminated.

Fifth Embodiment

Figure 15:
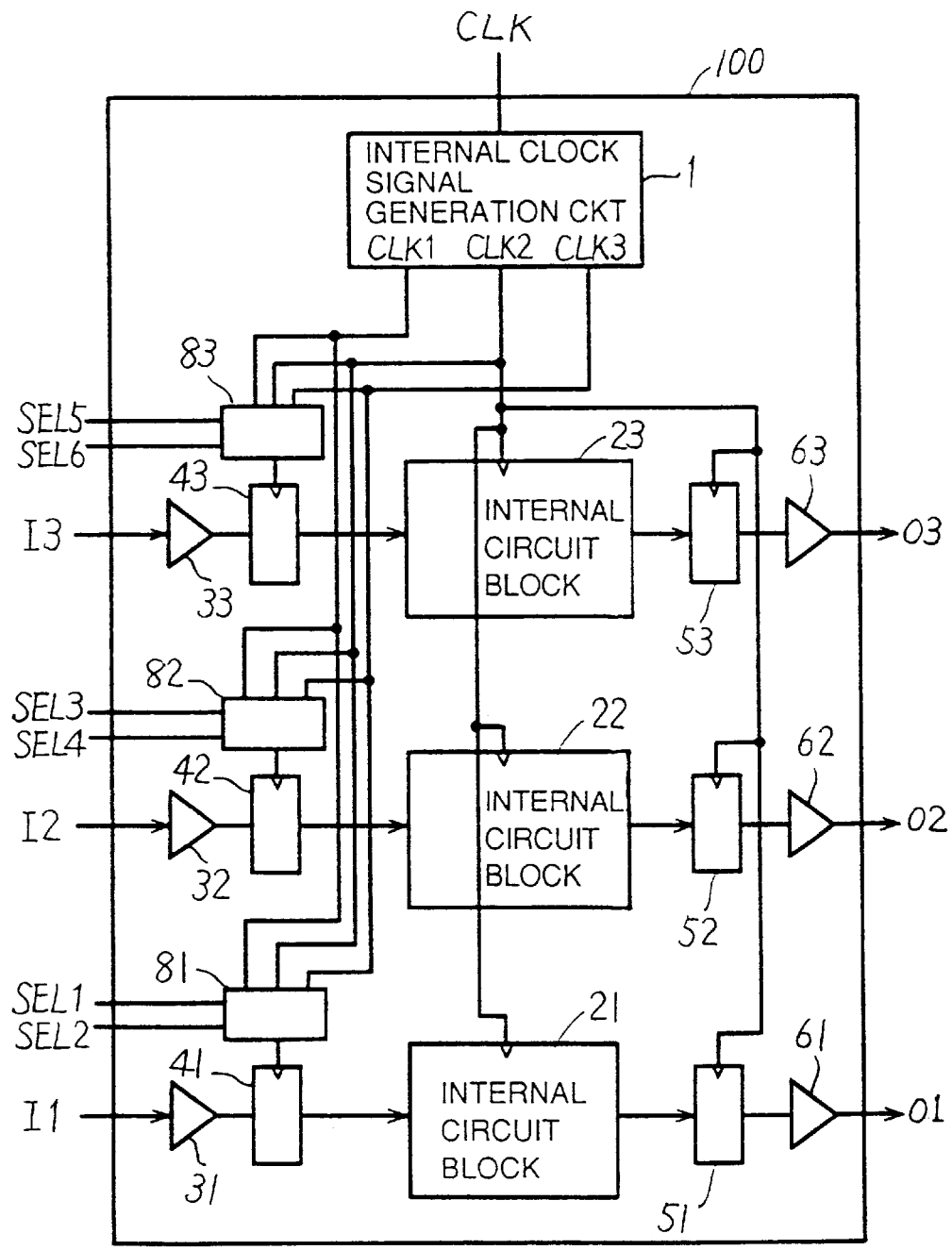
FIG. 15 is a block diagram showing the configuration of an LSI according to a fifth embodiment.

A fifth embodiment will be described. FIG. 15 is a block diagram showing the configuration of an LSI according to the fifth embodiment. The LSI in FIG. 15 is substantially identical to the LSI in FIG. 13 with a difference being that selectors 81, 82 and 83 are provided corresponding to input latch circuits 41, 42 and 43. The configuration of each of selectors 81, 82 and 83 is the same as the selector shown in FIG. 10.

Now, the operation of the entire LSI according to the fifth embodiment will be described. Note that portions in common with the LSI in FIG. 13 will not be described here.

In selector 81, an internal clock signal for output is selected in response to select signal SEL1 and SEL2. The internal clock signal selected by selector 81 is applied to input latch circuit 41.

In selector 82, an internal clock signal for output is selected in response to select signal SEL3 and SEL4. The internal clock signal selected by selector 82 is applied to input latch circuit 42.

In selector 83, an internal clock signal for output is selected in response to select signal SEL5 and SEL6. The internal clock signal selected by selector 83 is applied to input latch circuit 43. Input latch circuits 41, 42 and 43 operate in synchronization with the applied internal clock signal.

In this LSI, in each of input latch circuits, 41, 42 and 43, an internal clock signal to be applied is changed in response to a select signal for every input latch circuit. Accordingly, timings for receiving input data signals I1, I2 and I3 received by input latch circuits 41, 42 and 43 through input buffer circuit 31, 32 and 33 can be set variable for every input data signal.

With such a variable timing for receiving an input data signal for every input data signal, the following effect is provided in addition to the effect described in conjunction with the third embodiment. With a variable timing for an input data signal for every input data signal, input data signals I1, I2 and I3 can be received in different timings. As a result, simultaneous switching noises in LSIs can be eliminated.

Sixth Embodiment

Figure 16:
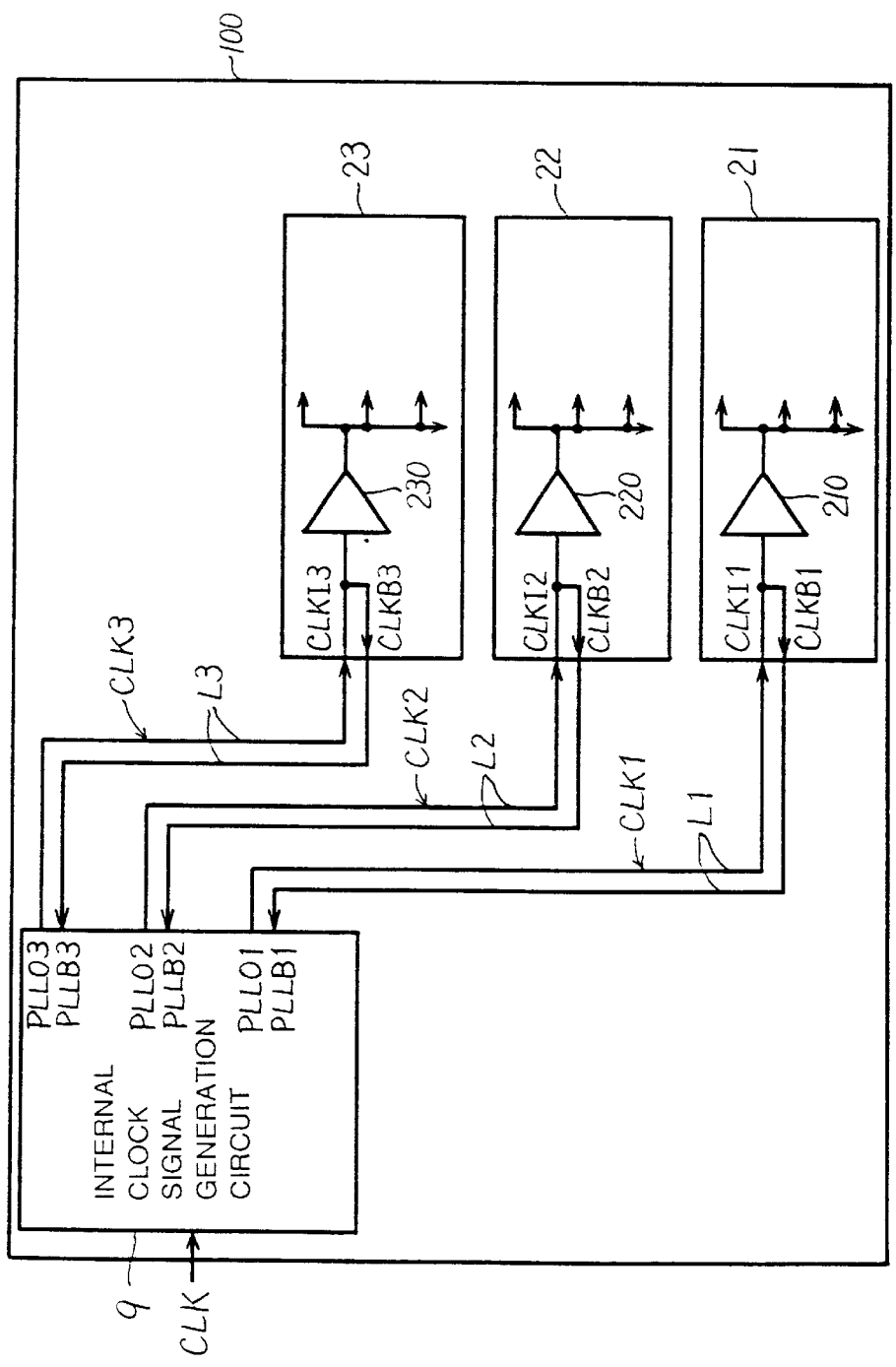
FIG. 16 is a block diagram showing the configuration of an essential part of an LSI according to a sixth embodiment.

Now, a sixth embodiment will be described. FIG. 16 is a block diagram showing the configuration of an essential part of an LSI according to the sixth embodiment. The LSI in FIG. 16 has internal clock signal generation circuit 9 having a different configuration from the LSI in FIG. 1 and internal clock signals are fed back to internal clock signal generation circuit 9 from internal circuit blocks 21, 22 and 23.

If there is a signal delay between internal clock signal generation circuit 9 and first internal circuit block 21, in the first internal clock signal CLK1 output from internal clock signal generation circuit 9, the phase of signal PLLO1 output in internal clock signal generation circuit 9 is different from the phase of signal CLKI1 arriving at first internal circuit block 21. Furthermore, in first internal clock signal CLK1, signal CLKB1 fed back to first internal circuit block 21 and signal PLLB1 arriving at internal clock signal generation circuit 9 are different in phase.

If there is a signal delay between internal clock signal generation circuit 9 and second internal circuit block 22, in second internal clock signal CLK2, signal PLLO2 output in internal clock signal generation circuit 9 and signal CLKI2 arriving at second internal circuit block 22 are different in phase. Furthermore, in second internal clock signal CLK2, signal CLKB2 fed back in second internal circuit block 22 and signal PLLB2 arriving at internal clock signal generation circuit 9 are different in phase.

If there is a signal delay between internal clock signal generation circuit 9 and third internal circuit block 23, in third internal clock signal CLK3, signal PLLO3 output in internal clock signal generation circuit 9 and signal CLKI3 arriving at third internal circuit block 23 are different in phase. In addition in third internal clock signal CLK3, signal CLKB3 fed back in third internal circuit block 23 and signal PLLB3 arriving at internal clock signal generation circuit 9 are different in phase.

Figure 17:
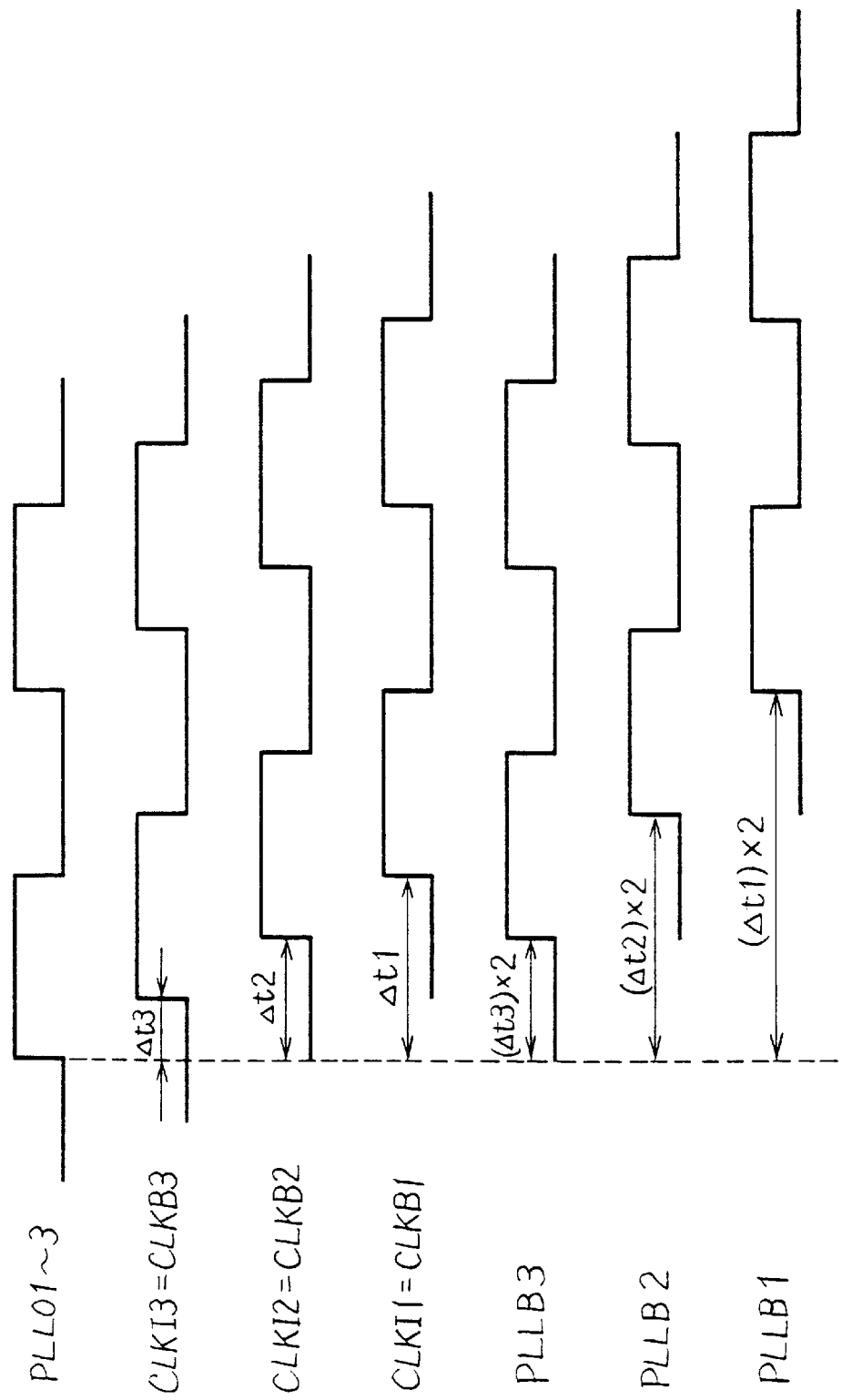
FIG. 17 is a timing chart for use in illustration of differences between the phases of internal clock signals in the LSI in FIG. 16.

FIG. 17 shows such phase differences between internal clock signals CLK1, CLK2 and CLK3. For first internal clock signal CLK1, a phase difference $\Delta t1$ is generated between signal PLLO1 and signal CLKI1 or CLKB1, and a phase difference $(\Delta t1) \times 2$ is generated between signal PLLO1 and signal PLLB1.

For second internal clock signal CLK2, a phase difference $\Delta t2$ is generated between signal PLLO2 and signal CLKI2 or signal CLKB2, and a phase difference $(\Delta t2) \times 2$ is generated between signal PLLO2 and signal PLLB2.

For third internal clock signal CLK3, a phase difference $\Delta t3$ is generated between signal PLLO3 and signal CLKI3 or signal CLKB3, and a phase difference $(\Delta t3) \times 2$ is generated between signal PLLO3 and PLLB3.

More specifically, a phase difference between an internal clock signal output from internal clock signal generation circuit 9 and an internal clock signal fed back thereto is twice a phase difference between the internal clock signal output from internal clock signal generation circuit 9 and an internal clock signal arriving at an internal circuit block.

Accordingly, a phase difference between an internal clock signal output from internal clock signal generation circuit 9 and an internal clock signal arriving at an internal circuit block is produced by multiplying a phase difference between the internal clock signal output from internal clock signal generation circuit 9 and an internal clock signal fed back thereto by ½. In order to match the phases of signal CLKI2 and signal CLKI3 with the phase of signal CLKI1, the phase of signal CLKI2 is delayed by the amount of $\Delta t1-\Delta t2$, and similarly the phase of signal CLKI3 is delayed by the amount of $\Delta t1-\Delta t3$.

Figure 18:
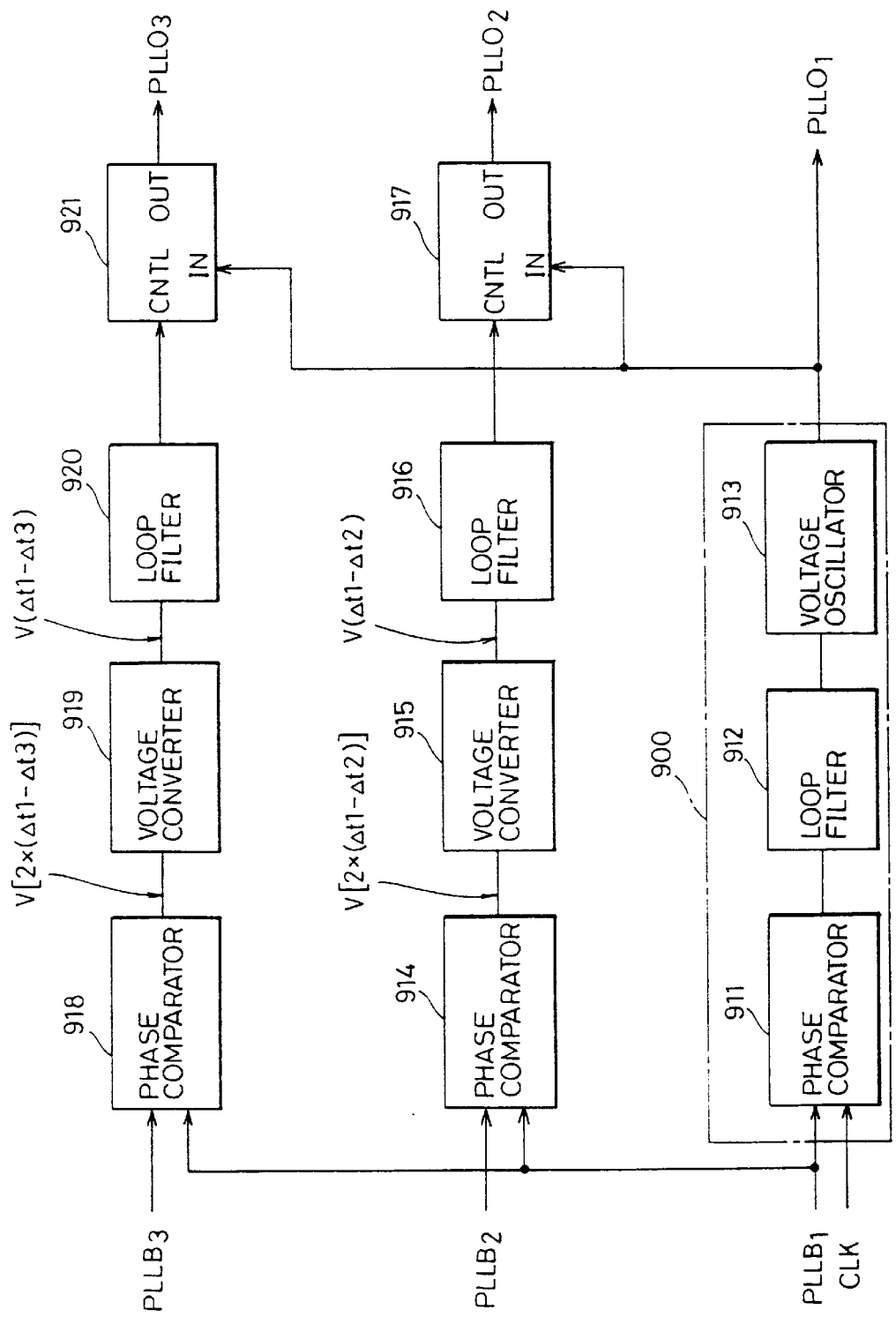
FIG. 18 is a block diagram showing the configuration of the internal clock signal generation circuit in FIG. 16.

Now, the configuration of internal clock signal generation circuit 9 will be described. FIG. 18 is a block diagram showing the configuration of internal clock signal generation circuit 9. Referring to FIG. 18, a phase comparator 911 receives external clock signal CLK and signal PLLB1. The output signal of phase comparator 911 is applied to delay circuits 917 and 921 through a loop filter 912 and a voltage control oscillator 913, and output as signal PLLO1. Phase comparator 911, loop filter 912 and voltage control oscillator 913 constitute a PLL circuit 900.

A phase comparator 914 receives signals PLLB1 and PLLB2. The output signal of phase comparator 914 is applied to a delay circuit 917 through a voltage converter 915 and a loop filter 916. Phase comparator 918 receives signals PLLB1 and PLLB3. The output signal of phase comparator 918 is applied to a delay circuit 921 through a voltage converter 919 and a loop filter 920. The output of delay circuit 917 is output as signal PLLO2. The output signal of delay circuit 921 is output as signal PLLO3.

Now, the operation of internal clock signal generation circuit 9 will be described in more detail. Phase comparator 911 outputs a signal of voltage corresponding to a phase difference between external clock signal CLK and signal PLLB1. Loop filter 912 eliminates a high frequency component of the output signal of phase comparator 911. Voltage control oscillator 913 changes the frequency of signal PLLO1 based on the voltage of the output signal loop filter 912.

Phase comparator 914 outputs a signal of voltage corresponding to a phase difference between signal PLLB1 and PLLB2. The voltage of the signal equals to $2 \times (\Delta t1-\Delta t2)$. Voltage converter 915 converts the voltage of the output signal of phase comparator 914 into half the voltage. The voltage of the output signal of voltage converter 915 equals to $\Delta t1-\Delta t2$. Loop filter 916 eliminates a high frequency component of the output signal of voltage converter 915.

Delay circuit 917 delays a clock signal applied from voltage control oscillator 913 in response to the voltage of a signal applied from loop filter 916, and outputs as signal PLLO2. More specifically, in delay circuit 917, the phase of signal PLLO2 is controlled such that the phase of signal CLKI1 coincides with the phase of signal CLKI2.

Phase comparator 918 outputs a signal at voltage corresponding to a phase difference between signal PLLB1 and signal PLLB3. The voltage of the signal equals to $2 \times (\Delta t1-\Delta t3)$. Voltage converter 919 converts the voltage of the output signal of phase comparator 918 into ½ the voltage. The voltage of the output signal of voltage converter 919 equals to $\Delta t1-\Delta t3$. Loop filter 920 eliminates a high frequency component of the output signal of voltage converter 919.

Delay circuit 921 delays a clock signal applied from voltage control oscillator 913 in response to the voltage of the signal applied from loop filter 920, and outputs as signal PLLO3. More specifically, in delay circuit 921, the phase of signal PLLO3 is controlled such that the phase of signal CLKI1 coincides with the phase of signal CLKI3.

Thus, in internal clock signal generation circuit 9, PLL circuit 900 synchronizes the phase of first internal clock signal CLK1 with the phase of external clock signal CLK. Furthermore, the phases of second and third internal clock signals CLK2 and CLK3 are controlled such that the phase of internal clock signal CLK2 arriving at second internal circuit block 22 and the phase of third internal clock signal CLK3 arriving at third internal circuit block 23 are in synchronization with the phase of first internal clock signal CLK1 arriving at first internal circuit block 21.

Therefore, in the LSI according to the sixth embodiment, the phases of internal clock signals CLK1, CLK2 and CLK3 are automatically synchronized with the phase of external clock signal CLK. As a result, clock skews between the internal clock signals are eliminated. In addition, since internal clock signal generation circuit 9 generates internal clock signals with PLL circuit 900 in the LSI, the unique effect obtained by the PLL circuit described in conjunction with the first embodiment is provided.

Seventh Embodiment

Now, a seventh embodiment will be described. The seventh embodiment is a variation of internal clock signal generation 9 in the LSI according to the sixth embodiment.

Figure 19:
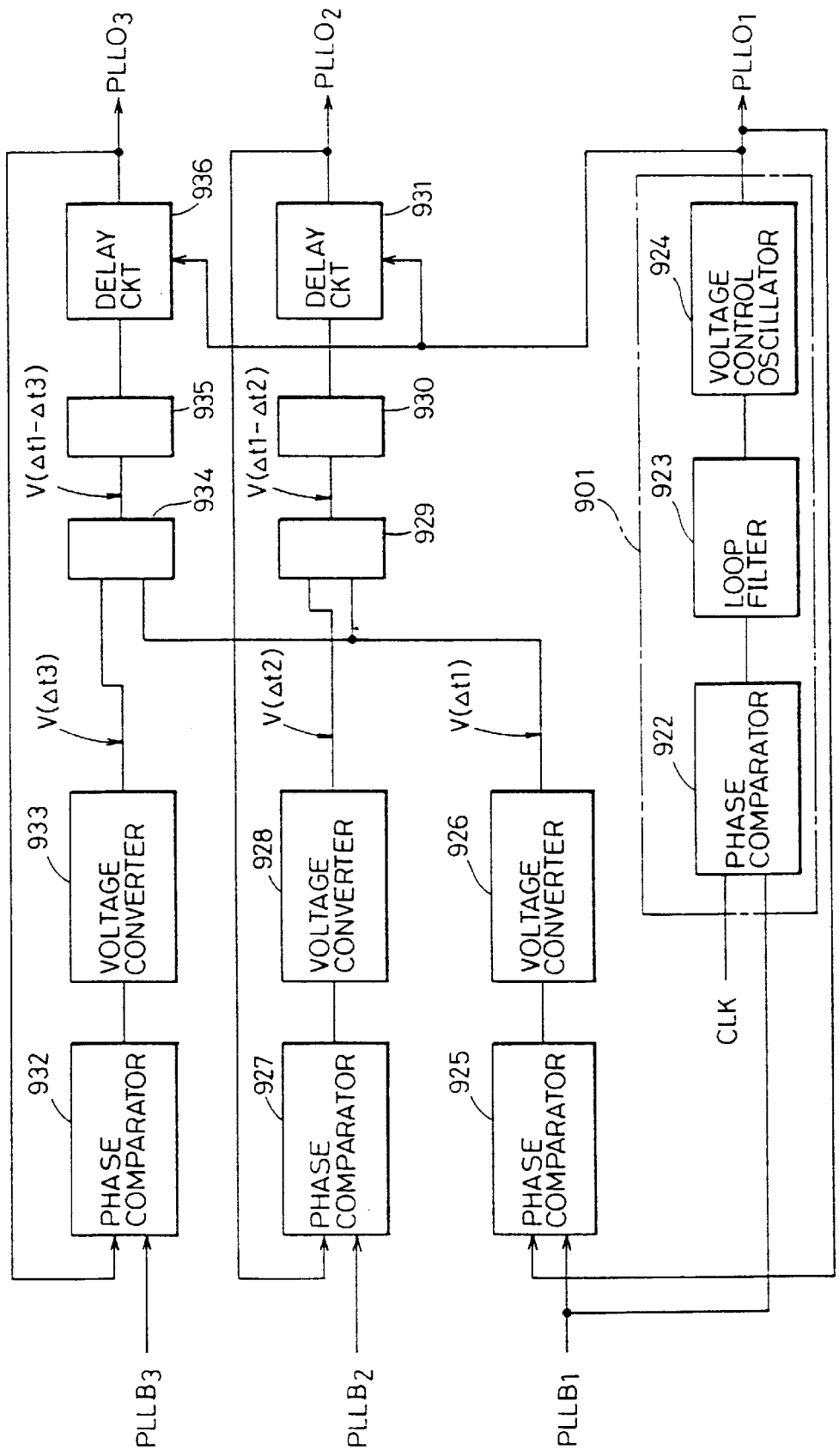
FIG. 19 is a block diagram showing the configuration of an internal clock signal generation circuit in an LSI according to a seventh embodiment.

FIG. 19 is a block diagram showing the configuration of internal clock signal generation circuit 9 in the LSI according to the seventh embodiment.

A phase comparator 922 receives external clock signal CLK and the fed back signal PLLO1. The output signal of phase comparator 922 is applied to delay circuits 931 and 936 through a loop filter 923 and a voltage control oscillator 924 and is output as signal PLLO1. Phase comparator 922, loop filter 923 and voltage control oscillator 924 constitute a PLL circuit 901.

A phase comparator 925 receives signal PLLO1 and the fed back signal PLLB1. The output signal of phase comparator 925 is applied to phase difference comparator 929 and 934 through a voltage converter 926. A phase comparator 927 receives signal PLLO2 and the fed back signal PLLB2. The output signal of phase comparator 927 is applied to a phase difference comparator 929 through a voltage converter 928.

A phase comparator 932 receives signal PLLO3 and the fed back signal PLLB3. The output signal of phase comparator 932 is applied to a phase difference comparator 934 through a voltage converter 933. The output signal of phase difference comparator 934 is applied to a delay circuit 936 through a loop filter 935. The output signal of delay circuit 931 is output as signal PLLO2 and is also fed back to phase comparator 927. The output signal of delay circuit 936 is output as signal PLLO3 and is also fed back to phase comparator 932.

Now, the operation of internal clock signal generation circuit 9 will be described in more detail. PLL circuit 901 operates similarly to PLL circuit 900 in FIG. 18 and synchronizes the phase of external clock signal CLK with the phase of signal PLLB1.

A phase comparator 925 outputs a signal at voltage corresponding to a phase difference between signal PLLO1 and signal PLLB1. A voltage converter 926 converts the output signal of phase comparator 925 into ½ the voltage. The voltage of the output signal of voltage converter 926 equals to Δt1 in FIG. 17.

A phase comparator 927 outputs a signal at voltage corresponding to a phase difference between signal PLLO2 and signal PLLB2. A voltage converter 928 converts the voltage of the output signal of phase comparator 927 into ½ the voltage. The voltage of the output signal of voltage converter 928 equals to Δt2 in FIG. 17.

Phase comparator 932 outputs a signal at voltage corresponding to a phase difference between signal PLLO3 and signal PLLB3. A voltage converter 933 converts the voltage of the output signal of phase comparator 932 into ½ the voltage. The voltage of the output signal of voltage converter 933 equals to Δt3 in FIG. 17.

A phase comparator 929 outputs a signal at voltage corresponding to a difference between the voltage of the output signal of voltage converter 926 and the voltage of the output signal of voltage converter 928. The voltage of the signal equals to Δt1–Δt2. A loop filter 930 eliminates a high frequency component of the output signal of phase difference comparator 929. Delay circuit 931 operates similarly to delay circuit 917 in FIG. 19 and outputs signal PLLO2.

A phase comparator 934 outputs a signal at voltage corresponding to a difference between the voltage of the output signal of voltage converter 926 and the voltage of the output signal of voltage converter 933. The voltage of the signal equals to Δt1–Δt3. A loop filter 935 eliminates a high frequency component of the output signal of a phase difference comparator 934. Delay circuit 936 operates similarly to delay circuit 921 in FIG. 19 and outputs signal PLLO3.

In internal clock signal generation circuit 9 in the LSI according to the seventh embodiment, the phase of first internal clock signal CLK1 is synchronized with the phase of external clock signal CLK by PLL circuit 901. Furthermore, as is the case with internal clock signal generation circuit 9 according to the sixth embodiment, the phases of internal clock signals CLK1, CLK2 and CLK3 arriving at internal circuit blocks 21, 22 and 23, respectively are synchronized.

Accordingly, in the internal clock signal generation circuit in the LSI according to the seventh embodiment, the phases of internal clock signals CLK1, CLK2 and CLK3 are automatically synchronized with the phase of external clock signal CLK. As a result, clock skews between the internal clock signals are eliminated. In addition, the LSI according to the seventh embodiment provides the same effect as that obtained in the LSI according to the sixth embodiment.

Eighth Embodiment

An eighth embodiment will be described. The eighth embodiment is a variation of internal clock signal generation circuit 9 in the LSI according to the sixth embodiment. The internal clock signal generation circuit according to the eighth embodiment implements the internal clock signal generation circuit shown in FIG. 18 with a reduced number of elements.

Figure 20:
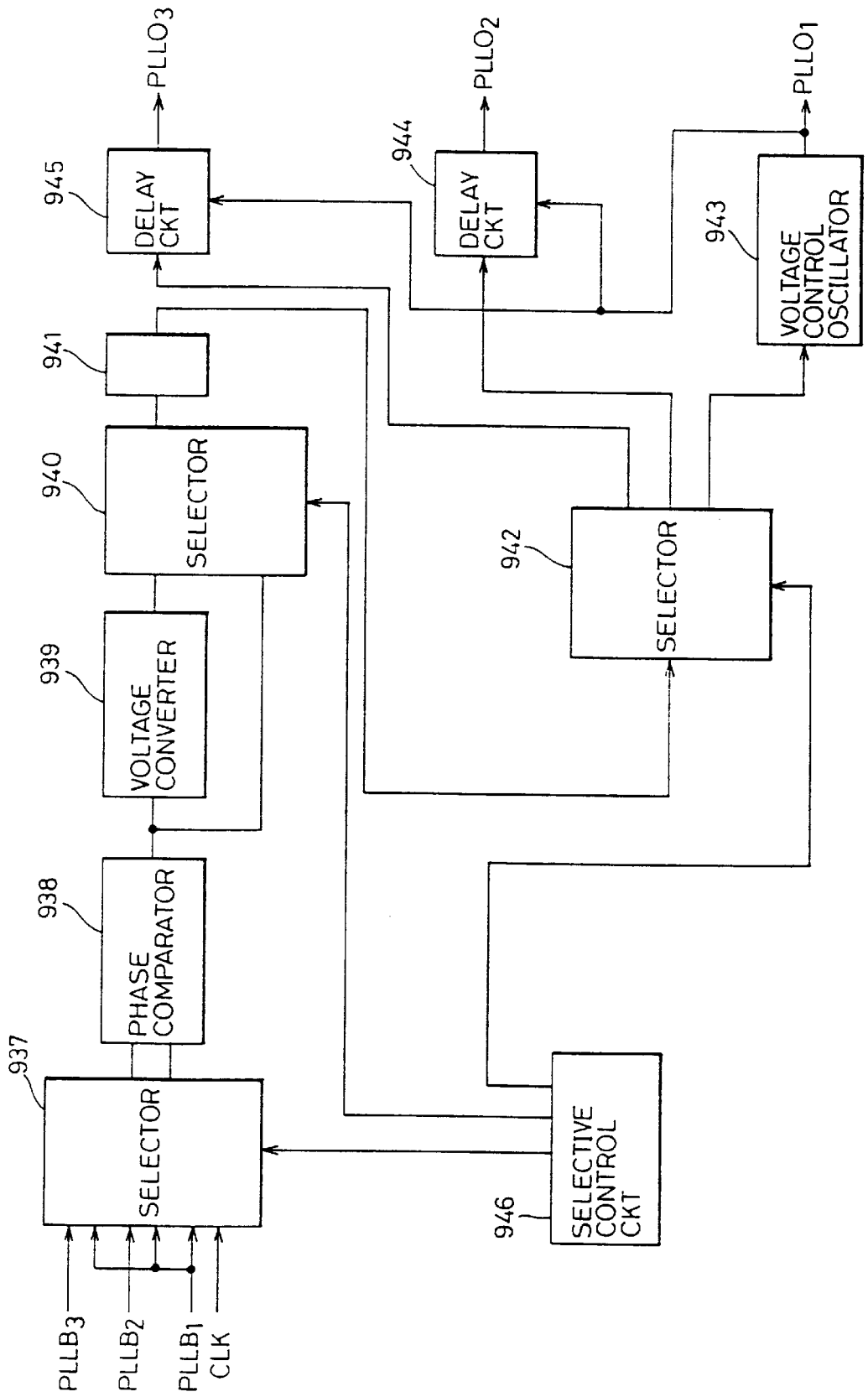
FIG. 20 is a block diagram showing the configuration of an internal clock signal generation circuit in an LSI according to an eighth embodiment.

FIG. 20 is a block diagram showing the configuration of internal clock signal generation circuit 9 in the LSI according to the eighth embodiment. Referring to FIG. 20, a selector 937 receives signals PLLB1, PLLB2, PLLB3 and external clock signal CLK. The output signal of selector 937 is applied to a phase comparator 938. The output signal of phase comparator 938 is applied to selector 940 through a voltage converter 939 and is also directly applied to a selector 940. The output signal of selector 940 is applied to a selector 942 through a loop filter 941.

The output signal of selector 942 is selectively applied to a voltage control oscillator 943, and delay circuits 944 and 945. The output signal of voltage control oscillator 943 is output as signal PLLO1 and also applied to delay circuit 944 and 945. The output signal of delay circuit 944 is output as signal PLLO2. The output signal of delay circuit 945 is output as signal PLLO3. The signal of a selective control portion 946 is applied to selectors 937, 940 and 942.

The operation of the internal clock signal generation circuit shown in FIG. 20 will be described in more detail. Selector 937 selectively outputs a pair of external clock signals CLK and PLLB1 (hereinafter referred to as first pair), a pair of signals PLLB1 and PLLB3 (hereinafter referred to as second pair), or a pair of signals PLLB1 and PLLB2 (hereinafter referred to as third pair), in response to a control signal applied from selective control portion 946.

Phase comparator 938 outputs a signal at voltage corresponding to a phase difference between the pair of two signals output from selector 937. Voltage converter 939 converts the voltage of the output signal of phase comparator 938 into ½ the voltage. Selector 940 outputs one of the output signals of phase comparator 938 and voltage converter 939, in response to a control signal applied from selective control portion 946. Loop filter 941 eliminates a high frequency component of the output signal of selector 940.

Selector 942 selectively provides one of voltage control oscillator 943, delay circuit 944 and delay circuit 945 with the output signal of loop filter 941, in response to a control signal applied from selective control portion 946. Voltage control oscillator 943 changes the frequency of signal PLLO1 in response to the voltage of the output signal of selector 942. Delay circuit 944 operates similarly to delay circuit 917 in FIG. 18, and outputs signal PLLO2. Delay circuit 945 operates similarly to delay circuit 921 in FIG. 18 and outputs signal PLLO3.

Selective control portion 946 controls selectors 937, 940 and 942 in the following manner.

When selector 937 selects the first pair of signals for output, selector 940 selects the output signal of phase comparator 938 for output. When selector 937 selects the second or third pair of signals for output, selector 940 selects the output signal of voltage converter 939 for output.

Selective control portion 946 makes such a control that when selector 937 selects the first pair of signals, selector 942 outputs the output signal of loop filter 941 to delay circuit 945. When selector 937 selects the second pair of signals for output, selector 942 outputs the output signal of loop filter 941 to delay circuit 944. When selector 937 selects the third pair of signals for output, selector 942 outputs the output signal of loop filter 941 to voltage control oscillator 943.

In the internal clock signal generation circuit, in a steady state, a control is made such that selector 937 selects the third pair of signals, selector 940 selects the output signal of phase comparator 938, and selector 942 selects the output signal to voltage control oscillator 943.

Before such a steady state is attained, a control is made such that the output signal of loop filter 941 is previously applied to delay circuits 944 and 945 from selector 942. When an output signal from selector 942 is applied to delay circuits 944 and 945, the applied output signal is held at delay circuits 944 and 945.

In the LSI according to the eighth embodiment, in addition to the effects obtained by the LSI according to the sixth embodiment, some of the elements can be advantageously shared between the circuits.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device operating in synchronization with an internal clock signal generated based on an externally input external clock signal, comprising:

internal clock signal generation means responsive to said external clock signal for generating a plurality of internal clock signals of different phases;

a plurality of internal circuit blocks operating in synchronization with the plurality of internal clock signals generated by said internal clock signal generation means; and a plurality of signal transmission paths provided between said internal clock signal generation means and said plurality of internal circuit blocks, respectively, said plurality of signal transmission paths each transmitting an internal clock signal to a corresponding one of said internal circuit blocks from said internal clock signal generation means and transmitting the internal clock signal transmitted to said internal circuit block to said internal clock signal generation means as a feedback signal, said internal clock signal generation means including phase locked loop means receiving said external clock signal and a first feedback signal among the plurality of feedback signals for synchronizing the phase of a first internal clock signal to be generated with the phase of said external clock signal based on a phase difference between said external clock signal and said first feedback signal, first phase comparison means receiving the first internal clock signal and the first feedback signal corresponding to the first internal clock signal for comparing the phases of these signals to produce a phase difference, second phase comparison means receiving a second internal clock signal among said internal clock signals and a second feedback signal corresponding to the second internal clock signal for comparing the phases of these signals to produce a phase difference, phase difference comparison means for comparing the phase differences produced by said first phase comparison means and said second phase comparison means, and for producing a difference between the phase differences, and delay means receiving and delaying based on the difference produced by said phase difference comparison means said first internal clock signal for generating said second internal clock signal.

2. A semiconductor integrated circuit device operating in synchronization with an internal clock signal generated based on an externally input external clock signal, comprising:

internal clock signal generation means responsive to said external clock signal for generating a plurality of internal clock signals of different phases;

a plurality of internal circuit blocks operating in synchronization with the plurality of internal clock signals generated by said internal clock signal generation means; and a plurality of signal transmission paths provided between said internal clock signal generation means and said plurality of internal circuit blocks, respectively, said plurality of signal transmission paths each transmitting an internal clock signal to a corresponding one of said internal circuit block from said internal clock signal generation means and transmitting the internal clock signal transmitted to said internal circuit block to said internal clock signal generation means as a feedback signal, said internal clock signal generation means including first select means receiving said external clock signal and first and second feedback signals among the plurality of feedback signals for selectively outputting a first pair of signals formed of said external clock signal and said first feedback signal and a second pair of signals formed of said first feedback signal and said second feedback signal, phase comparison means receiving the pair of signals of said first select means for comparing the phases of the pair of signals, voltage control oscillation means responsive to the output signal of said phase comparison means for generating a first internal clock signal, delay means delaying the first internal clock signal generated by said voltage control oscillation means for generating a second internal clock signal based on the output signal of said phase comparison means, second select means for selectively applying the output signal of said phase comparison means to said voltage control oscillation means and said delay means; and selective control means for controlling said first and second select means so that the output signal of said second select means is applied to said voltage control oscillation means when said first select means selects said first pair of signals and the output signal of said second select means is applied to said delay means when said first select means selects said second pair of signals.

3. A semiconductor integrated circuit device operating in synchronization with an internal clock signal generated based on an externally applied external clock signal, comprising:

internal clock signal generation means responsive to the external clock signal for generating a plurality of internal clock signals of different phases, said internal clock signal generation means including phase locked loop means for synchronizing the phase of an internal clock signal to be fed back among said plurality of internal clock signals with the phase of the external clock signal;

output latch means for latching a data signal to be output externally from said semiconductor integrated circuit device;

signal selective supply means for selectively supplying the plurality of internal clock signals generated by said internal clock signal generation means to said output latch means, said output latch means latching the data signal in synchronization with the supplied internal clock signal; and an internal circuit block operating in synchronization with one of said plurality of internal clock signals for supplying said output latch means with said data signal to be externally output.

4. A semiconductor integrated circuit device operating in synchronization with an internal clock signal generated based on an externally input external clock signal, comprising:

internal clock signal generation means responsive to the external clock signal for generating a plurality of internal clock signals of different phases, said internal clock signal generation means including phase locked loop means for synchronizing the phase of an internal clock signal to be fed back among said plurality of internal clock signals with the phase of the external clock signal;

input latch means for latching a data signal input externally to said semiconductor integrated circuit device;

signal selective supply means for selectively supplying said input latch means with the plurality of internal clock signals generated by said internal clock signal generation means, said input latch means latching the data signal in synchronization with the supplied internal clock signal; and an internal circuit block operating in synchronization with one of said plurality of internal clock signals and performing a prescribed processing to the data signal latched by said input latch means.

5. A semiconductor integrated circuit device operating in synchronization with an internal clock signal generated based on an externally input external clock signal, comprising:

internal clock signal generation means responsive to the input external clock signal for generating a plurality of internal clock signals of different phases, said internal clock signal generation means including phase locked loop means for synchronizing the phase of an internal clock signal to be fed back among said plurality of internal clock signals with the phase of the input external clock signal;

a plurality of output latch means each for latching a data signal to be externally output from said semiconductor integrated circuit device; and a plurality of signal selective supply means provided corresponding to said plurality of output latch means, said plurality of signal selective supply means each for selectively supplying a corresponding output latch means with one of the plurality of internal clock signals generated by said internal clock signal generation means, said output latch means latching the data signal in synchronization with the supplied internal clock signal.

6. The semiconductor integrated circuit device as recited in claim 5, wherein said plurality of signal selective supply means supply said plurality of output latch means with the internal clock signals of different phases.

7. A semiconductor integrated circuit device operating in synchronization with an internal clock signal generated based on an externally input external clock signal, comprising:

internal clock signal generation means responsive to the input external clock signal for generating a plurality of internal clock signals of different phases, said internal clock signal generation means including phase locked loop means for synchronizing the phase of an internal clock signal to be fed back among said plurality of internal clock signals with the phase of the input external clock signal;

a plurality of input latch means each for latching a data signal input externally to said semiconductor integrated circuit device; and a plurality of signal selective supply means provided corresponding to said plurality of input latch means, said plurality of signal selective supply means each for selectively supplying a corresponding input latch means with one of the plurality of internal clock signals generated by said internal clock signal generation means, said input latch means latching the data signal in synchronization with the supplied internal clock signal.

8. The semiconductor integrated circuit device as recited in claim 7, wherein said plurality of signal selective supply means supplying said plurality of input latch means with the internal clock signals of different phases.

* * * * *